(12) United States Patent
Yuasa et al.

(10) Patent No.: US 11,011,685 B2
(45) Date of Patent: May 18, 2021

(54) METHOD OF MANUFACTURING LIGHT-EMITTING DEVICE

(71) Applicant: NICHIA CORPORATION, Anan (JP)

(72) Inventors: Taiki Yuasa, Tokushima (JP); Daisuke Iwakura, Komatsushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/799,017

(22) Filed: Feb. 24, 2020

(65) Prior Publication Data

US 2020/0194635 A1 Jun. 18, 2020

Related U.S. Application Data

(62) Division of application No. 15/993,014, filed on May 30, 2018, now Pat. No. 10,608,150.

(30) Foreign Application Priority Data

May 31, 2017 (JP) .............................. JP2017-108248

(51) Int. Cl.
| | | |
|---|---|---|
| *H01L 33/50* | (2010.01) | |
| *H01L 33/48* | (2010.01) | |
| *H01L 33/60* | (2010.01) | |
| *H01L 33/44* | (2010.01) | |
| *H01L 33/46* | (2010.01) | |

(52) U.S. Cl.
CPC .......... *H01L 33/505* (2013.01); *H01L 33/44* (2013.01); *H01L 33/486* (2013.01); *H01L 33/502* (2013.01); *H01L 33/60* (2013.01); *H01L 33/46* (2013.01); *H01L 33/504* (2013.01);

(Continued)

(58) Field of Classification Search
None
See application file for complete search history.

(56) References Cited

U.S. PATENT DOCUMENTS

| | | |
|---|---|---|
| 2014/0185299 A1 | 7/2014 | Sanga et al. |
| 2014/0191258 A1 | 7/2014 | Akimoto et al. |

(Continued)

FOREIGN PATENT DOCUMENTS

| | | |
|---|---|---|
| JP | 2010157638 A | 7/2010 |
| JP | 2012134355 A | 7/2012 |

(Continued)

*Primary Examiner* — Whitney Moore
(74) *Attorney, Agent, or Firm* — Hunton Andrews Kurth LLP

(57) ABSTRACT

A method of manufacturing a light-emitting device includes steps of: preparing at least one first member each including (i) a light-transmissive member having a top surface, a bottom surface, and a lateral surface contiguous with the top surface and the bottom surface, (ii) a phosphor layer disposed below the bottom surface, and (iii) a cover layer disposed on a lateral surface of the phosphor layer and the lateral surface of the light-transmissive member; and, for each of the at least one first member, mounting a light-emitting element on a base having a fat plate shape, bonding the light-emitting element and the phosphor layer of the first member together, placing a frame body on the base so as to surround the light-emitting element, and filling a light-reflective member in the frame body so that the light-reflective member covers at least a portion of the cover layer of the first member.

18 Claims, 18 Drawing Sheets

(52) U.S. Cl.
CPC ............... *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 2015/0325749 A1* | 11/2015 | Katsuno | ................. H01L 33/30 257/98 |
| 2016/0093777 A1 | 3/2016 | Sato et al. | |
| 2016/0093780 A1 | 3/2016 | Beppu et al. | |
| 2016/0093781 A1 | 3/2016 | Tamaki et al. | |
| 2016/0181483 A1 | 6/2016 | Eichenberg et al. | |
| 2016/0240746 A1* | 8/2016 | Yun | ....................... H01L 33/502 |
| 2017/0062680 A1 | 3/2017 | Yoo et al. | |

FOREIGN PATENT DOCUMENTS

| | | |
|---|---|---|
| JP | 2013065726 A | 4/2013 |
| JP | 2014130911 A | 7/2014 |
| JP | 2016072304 A | 5/2016 |
| JP | 2016072471 A | 5/2016 |
| JP | 2016532898 A | 10/2016 |
| WO | 2011/004795 A1 | 1/2011 |
| WO | 2011/016433 A1 | 2/2011 |
| WO | 2014/081042 A1 | 5/2014 |

* cited by examiner

METHOD OF MANUFACTURING LIGHT-EMITTING DEVICE

CROSS-REFERENCE TO RELATED APPLICATIONS

This is a divisional application of the U.S. patent application Ser. No. 15/993,014 filed on May 30, 2018, which claims priority under 35 U.S.C. § 119 to Japanese Patent Application No. 2017-108248, filed on May 31, 2017, the disclosures of which are incorporated herein by reference.

BACKGROUND

1. Field of the Invention

The present disclosure relates to a light-emitting device and a method for manufacturing the light-emitting device.

2. Description of Related Art

Conventionally, red LEDs are used in various fields as light sources, for example, of automotive tail lamps, traffic signals, and backlights of liquid crystal panels. Meanwhile, red LEDs composed of the quaternary material system are known to exhibit inferior temperature characteristics than green LEDs and blue LEDs and suffer from a decrease in the output at high temperatures.

In view of this, light-emitting devices with increased red emission efficiency have been recently proposed without using red LEDs. For example, Japanese Patent Publication No. 2014-130911 proposes a light-emitting device including a blue LED, a phosphor layer containing red phosphor, and a dielectric multilayer film interposed therebetween to reflect blue light, whereby the red phosphor is efficiently excited by blue light and thus red emission efficiency is increased.

However, in the above-described light-emitting device, the amount of blue light that passes through the dielectric multilayer film increases as the blue light enters the dielectric multilayer film at a larger angle of incidence, where the angle of incidence is defined in the range of 0° to 90°. For this reason, when the above-described light-emitting device is seen from an oblique angle, the color purity of the red light may be low because the red light emitted by the phosphor containing layer is blended with the blue light passing through the dielectric multilayer film.

The embodiments described in the present disclosure each can provide a light-emitting device with small amount of light leakage from a light-emitting element even at an oblique angle to the light-emitting device, and provide a method for manufacturing the light-emitting device.

SUMMARY

A method of manufacturing a light-emitting device according to an embodiment of the present disclosure includes steps of: preparing at least one first member each including (i) a light-transmissive member having a top surface, a bottom surface opposite the top surface, and a lateral surface contiguous with the top surface and the bottom surface, (ii) a phosphor layer disposed below the bottom surface of the light-transmissive member, and (iii) a cover layer disposed on a lateral surface of the phosphor layer and the lateral surface of the light-transmissive member; and, for each of the at least one first member, providing a base having a flat plate shape, mounting a light-emitting element on the base, bonding the light-emitting element and the phosphor layer of the first member together, placing a frame body on the base so as to surround the light-emitting element, and filling a light-reflective member in the frame body so that the light-reflective member covers at least a portion of the cover layer of the first member.

A method of manufacturing a light-emitting device according to an embodiment of the present another disclosure includes steps of: preparing at least one second member each including (i) a light-transmissive member having a top surface, a bottom surface opposite the top surface, and a lateral surface contiguous with the top surface and the bottom surface, (ii) a phosphor layer disposed below the bottom surface of the light-transmissive member, (iii) a cover layer disposed on a lateral surface of the phosphor layer and the lateral surface of the light-transmissive member, and (iv) a light-emitting element disposed below the phosphor layer; and, for each of the at least one second member, providing a base having a flat plate shape, mounting the light-emitting element of the second member on the base, placing a frame body on the base so as to surround the light-emitting element, and filling a light-reflective member in the frame body so that the light-reflective member covers at least a portion of the cover layer of the second member.

A method of manufacturing a light-emitting device according to an embodiment of the present another disclosure includes steps of: preparing at least one third member each including (i) a light-transmissive member having a top surface, a bottom surface opposite the top surface, and a lateral surface contiguous with the top surface and the bottom surface, (ii) a phosphor layer disposed above the top surface of the light-transmissive member, (iii) a cover layer disposed on a lateral surface of the phosphor layer and the lateral surface of the light-transmissive member, and (iv) a light-emitting element disposed below the light-transmissive member; and, for each of the at least one third member, providing a base having a flat plate shape, mounting the light-emitting element of the third member on the base, placing a frame body on the base so as to surround the light-emitting element, and filling a light-reflective member in the frame body so that the light-reflective member covers at least a portion of the cover layer of the third member.

BRIEF DESCRIPTION OF THE DRAWINGS

A more complete appreciation of embodiments of the invention and many of the attendant advantages thereof will be readily obtained by reference to the detailed description below when considered in connection with the accompanying drawings.

DESCRIPTION OF EMBODIMENTS

Hereinafter, a description will be given of a light-emitting device and a method for manufacturing the light-emitting device. Drawings referenced in the following description schematically shows embodiments. Thus, scales of members, distances between members, and positional relation between members or the like may have been presented in an exaggerated manner, and illustration of a portion of a member may have been omitted. Furthermore, the scale and distances between members may not match between a plan view and its corresponding cross-sectional view. In the following description, members that are the same or analogous will be given the same name or number in principle, and duplicative descriptions will be appropriately omitted. The terms such as "upper" and "lower" herein indicate relative positions of constituent elements, and are not intended to represent their absolute positions.

First Embodiment

Configuration of Light-emitting Device

Figure 1A:
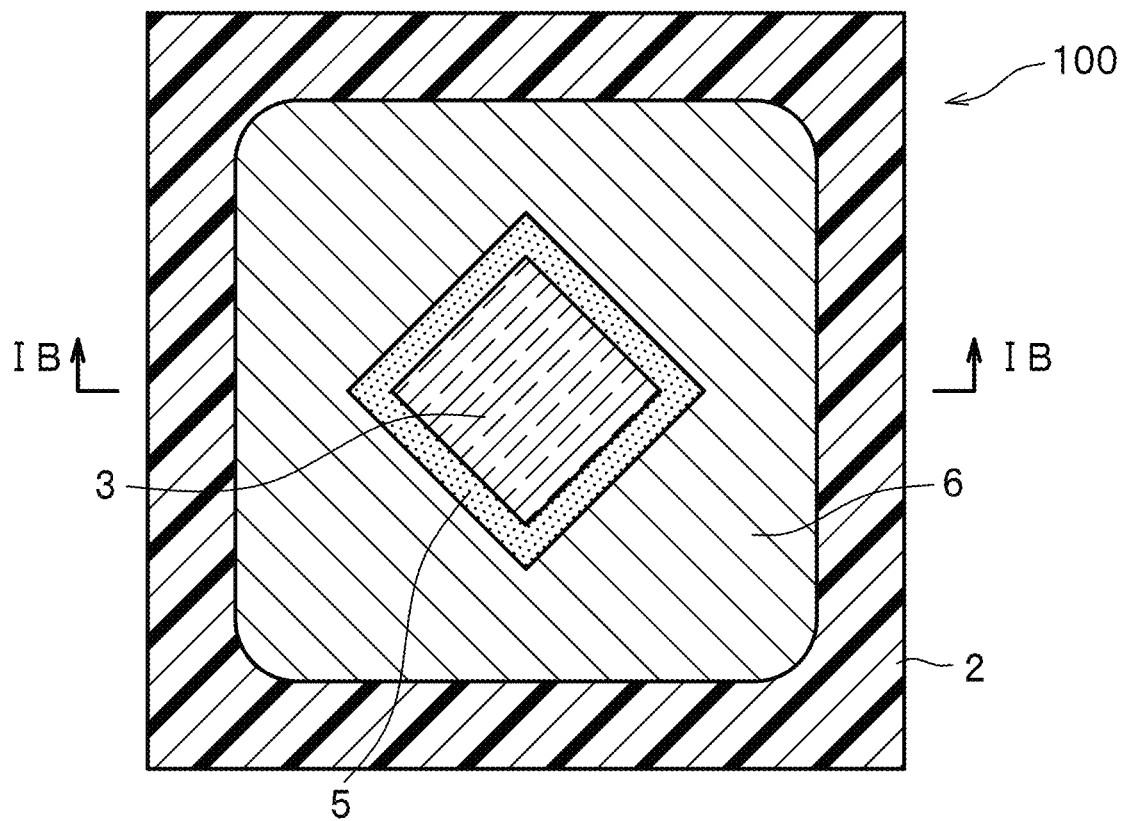
FIG. 1A is a plan view showing the configuration of a light-emitting device according to the first embodiment.
Figure 1B:
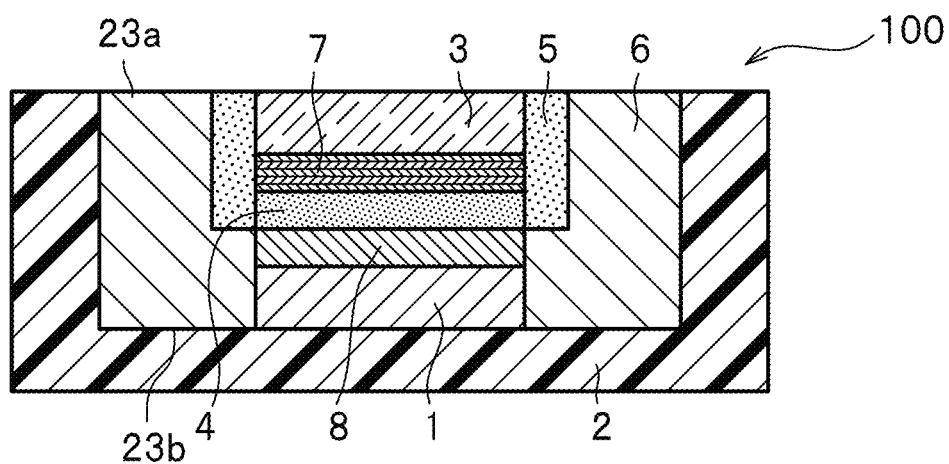
FIG. 1B is a cross-sectional view taken along line IB-IB in FIG. 1A, showing the configuration of the light-emitting device according to the first embodiment.

First, a description will be given of the configuration of a light-emitting device 100 according to a first embodiment with reference to FIGS. 1A and 1B. FIG. 1A is a plan view showing the configuration of the light-emitting device 100 according to the first embodiment. FIG. 1B is a cross-sectional view taken along line IB-IB in FIG. 1A, showing the configuration of the light-emitting device 100 according to the first embodiment. Note that hatching patterns applied to the members shown in the cross-sectional view of FIG. 1B are correspondingly applied to the members shown in FIG. 1A.

The light-emitting device 100 includes a light-transmissive member 3 having a first surface, a second surface opposite the first surface, and third surfaces each contiguous with the first surface and the second surface; a phosphor layer 4 disposed opposite to the second surface of the light-transmissive member 3; a cover layer 5 disposed on lateral surfaces of the phosphor layer 4 and the third surfaces of the light-transmissive member 3; a light-emitting element 1 disposed opposite to the phosphor layer 4; and a light-reflective member 6 covering at least a portion of the cover layer 5. The light-emitting element 1 is disposed on a base 2.

The light-emitting element 1 has a first surface, a second surface opposite the first surface, and third surfaces each contiguous with the first surface and the second surface, wherein the first surface, the second surface, and the third surfaces respectively correspond to an upper surface, a lower surface, and lateral surfaces of the light-emitting element 1. The light-emitting element 1 is disposed such that: the first surface of the light-emitting element 1 is opposite to the phosphor layer 4; the second surface of the light-emitting element 1 is disposed on a bottom surface 23*b* of a recess 23*a* of the base 2; and the third surfaces of the light-emitting element 1 are surrounded and covered by the light-reflective member 6. This light-emitting element 1 is electrically connected to wiring disposed on the base 2 and is configured to emit blue light.

The light-emitting element 1 has a substantially square shape in plan view. In plan view, the area of the light-emitting element 1 may be the same as or smaller than that of the phosphor layer 4. The light-emitting element 1 may have a polygonal shape, such as square, rectangular, triangular, or hexagonal, or a round shape such as circular or oval, in plan view.

The base 2 has a substantially square external shape in plan view, and has an inner wall defining an inner surface of the recess 23*a* and having a substantially square shape in plan view. The base 2 is for example made of ceramics, a thermosetting resin, a thermoplastic resin or the like. The base 2 may be of a flat plate shape not having the recess 23*a*.

The light-transmissive member 3 has a first surface, a second surface opposite the first surface, and third surfaces each contiguous with the first surface and the second surface, wherein the first surface, the second surface, and the third surfaces respectively correspond to an upper surface, a lower surface, and lateral surfaces of the light-transmissive member 3. The light-transmissive member 3 is disposed such that: the second surface of the light-transmissive member 3 is opposite to the phosphor layer 4 with a dielectric multilayer film 7 interposed therebetween; and the third surfaces of the light-transmissive member 3 are surrounded and covered by the cover layer 5. The dielectric multilayer film 7 returns light having transmitted through the phosphor layer 4 to the phosphor layer 4 almost without leakage to the outside. Thus, the wavelength conversion is efficiently performed on the leaking light from the light-emitting element 1.

Preferably, the light-transmissive member 3 is formed of a material having good light-transmissivity, such as glasses, ceramics, acrylic resins, silicone resins, and epoxy resins.

The phosphor layer 4 is bonded with the light-emitting element 1 via, for example, a bonding member 8, and absorbs at least a portion of the blue light emitted by the light-emitting element 1 to emit yellow-red to red light. Here, the yellow-red to red light means light having a wavelength range from yellow-red to red. The greater the amount of the blue light emitted by the light-emitting element 1 and incident into the phosphor layer 4, the greater the amount of the yellow-red to red light emitted by the phosphor layer 4 by efficiently exciting the phosphor. The phosphor layer 4 may be formed by mixing a phosphor with a matrix material, or may be solely made of a phosphor.

Preferably, the matrix material for the phosphor layer 4 is a material having good light-transmissivity, examples of which include silicone resins, epoxy resins, phenolic resins, polycarbonate resins, acrylic resins, fluorine resins, modified resins of these resins, and hybrid resins of these resins. In particular, silicone resins have good resistance to weather, heat, and light, and thus are preferably used as the matrix material of the phosphor layer 4.

The phosphor contained in the phosphor layer 4 is a material that absorbs at least a portion of the blue light emitted by the light-emitting element 1 and thereby emits yellow-red to red light. Examples of the material for the phosphor include $CaAlSiN_3$:Eu phosphor (CASN phosphor), $(Sr,Ca)AlSiN_3$:Eu phosphor (SCASN phosphor), and $K_2SiF_6$:Mn phosphor (KSF phosphor), and combinations of these phosphors.

The cover layer 5 is disposed in a rectangular loop shape to surround and cover the lateral surfaces of the phosphor layer 4, the lateral surfaces of the dielectric multilayer film 7, and the third surfaces of the light-transmissive member 3. The cover layer 5 absorbs at least a portion of the blue light emitted by the light-emitting element 1 and emits or presents yellow-red to red light. The cover layer 5 also absorbs blue light that has passed through the dielectric multilayer film 7.

Disposing the cover layer 5 so as to cover from the lateral surfaces of the phosphor layer 4 to the third surfaces of the light-transmissive member 3 increases the amount of blue light converted to yellow-red to red light. With this configuration, even when a large amount of blue light passes through the dielectric multilayer film 7 due to a great angle of incidence to the dielectric multilayer film 7, the light-emitting device 100 has small light leakage from the light-emitting element 1. Incidentally, the angle of incidence is defined in the range of 0° to 90°.

The cover layer 5 may be a phosphor layer or a pigment layer. When the cover layer 5 is a phosphor layer, the phosphor in the phosphor layer absorbs at least a portion of the blue light to emit yellow-red to red light. When the cover layer 5 is a pigment layer, the pigment in the pigment layer absorbs at least a portion of the blue light to present yellow-red to red light. The pigment itself does not emit light. When the cover layer 5 contains phosphor, the density of the phosphor in the phosphor layer 4 is preferably greater than that of the phosphor in the cover layer 5.

Preferably, the cover layer 5 contains matrix material having good light-transmissivity, examples of which include silicone resins, epoxy resins, phenolic resins, polycarbonate resins, acrylic resins, fluorine resins, and modified resins of these resins, and hybrid resins of these resins. In particular, silicone resins have good resistance to weather, heat, and light, and thus are preferably used as the matrix material of the cover layer 5.

Examples of the material for the phosphor contained in the cover layer 5 include: CASN phosphor, SCASN phosphor, KSF phosphor, and combinations of the foregoing.

Examples of the material for the pigment contained in the cover layer 5 include: perylene based pigments, titanium nickel antimony oxides, and combinations of these.

Preferably, the light-reflective member 6 is disposed so as to cover at least a portion of the cover layer 5. This is because the amount of light traveling upward from the light-emitting element 1 can be increased. In the accompanying drawings, the light-reflective member 6 covers outer lateral surfaces and a lower surface of the cover layer 5, but does not cover an upper surface of the cover layer 5. More preferably, when the base 2 is constructed to have the recess 23a, the light-reflective member 6 is filled in the recess 23a to cover the cover layer 5. The light-reflective member 6 serves to increase the light extraction efficiency of the light-emitting device 100 by efficiently reflecting the yellow-red to red light emitted or presented by the cover layer 5.

Preferably, the light-reflective member 6 contains a matrix material having good light-transmissivity, examples of which include: silicone resins, modified silicone resins, hybrid silicone resins, epoxy resins, modified epoxy resins, urea resins, diallyl phthalate resins, phenolic resins, and unsaturated polyester resins.

Preferably, the light-reflective member 6 contains light-reflective substance having a large difference in the refractive index from the matrix material of the light-reflective member 6. Examples of such a light-reflective substance include: titanium oxide, silicon oxide, zirconium oxide, potassium titanate, alumina, aluminum nitride, and boron nitride. In particular, titanium oxide has high stability against moisture and the like and also has good thermal conductivity, and thus is preferably used as light-reflective substance. The light-reflective substance is preferably made of particles with an average grain diameter of 0.001 μm to 10 μm, or more preferably particles with an average grain diameter of 0.001 μm to 0.05 μm. Particles having an average grain diameter within the above-mentioned range may increase the effect of light scattering, resulting in an increase in the light extraction efficiency of the light-emitting device 100.

The dielectric multilayer film 7 is disposed between the light-transmissive member 3 and the phosphor layer 4 and serves to efficiently cause the blue light emitted by the light-emitting element 1 to enter the phosphor layer 4 or the cover layer 5. That is, the dielectric multilayer film 7 has high reflectance to the blue light emitted by the light-emitting element 1 and has high light-transmissivity to the yellow-red to red light emitted by the phosphor layer 4 and the yellow-red to red light emitted or presented by the cover layer 5. Preferably, the reflectance of the dielectric multilayer film 7 is 90% or greater for blue light with an angle of incidence of 0° to 30°, or more preferably 95% or greater for blue light with an angle of incidence of 0° to 30°.

The dielectric multilayer film 7 is formed by alternately stacking at least two or more kinds of dielectric layers. Examples of the material for the dielectric layer include $SiO_2$ and $Nb_2O_5$. The number of the dielectric layers is not particularly limited.

The bonding member 8 bonds the light-emitting element 1 and the phosphor layer 4 together. Preferably, the bonding member 8 is made of the same material as the matrix material of the phosphor layer 4. This selection of materials results in a small difference in the refractive index between the phosphor layer 4 and the bonding member 8, and thus causes a large amount of blue light emitted from the light-emitting element 1 to enter the phosphor layer 4. Preferably, the bonding member 8 is formed of a material having good light-transmissivity, examples of which include: silicone resins, epoxy resins, acrylic resins, and polyimide resins.

As described, in the light-emitting device 100 according to the first embodiment, the cover layer 5 is disposed on the lateral surfaces of the phosphor layer 4 and the third surfaces of the light-transmissive member 3. If the cover layer 5 is not provided and the third surfaces of the light-transmissive member 3 are directly covered by the light-reflective member 6, leakage of the light from the light-emitting element 1 occurs near the interface between the third surfaces of the light-transmissive member 3 and the light-reflective member 6. In contrast, by disposing the cover layer 5 on the lateral surfaces of the phosphor layer 4 and the third surfaces of the light-transmissive member 3, the light emitted by the light-emitting element 1 is prevented from leaking to the outside. With this configuration, the amount of light leakage from the light-emitting element is small even at an oblique angle to the light-emitting device 100, allowing the light-emitting device 100 to present uniform red color independent of the viewing angle.

Modifications

Next, a description will be given of modifications of the light-emitting device 100 according to the first embodiment with reference to FIGS. 2A, 2B, and 2C. A first modification of the light-emitting device 100 shown in FIG. 1 is a light-emitting device 100A, in which the light-emitting element 1 and the phosphor layer 4 are bonded together in a different configuration from the first embodiment. A second modification of the light-emitting device 100 shown in FIG. 1 is a light-emitting device 100B, in which the shape of the bonding member 8 has been changed. A third modification of the light-emitting device 100 shown in FIG. 1 is a light-emitting device 100C, in which the structure of the light-reflective member 6 has been changed.

First Modification

Figure 2A:
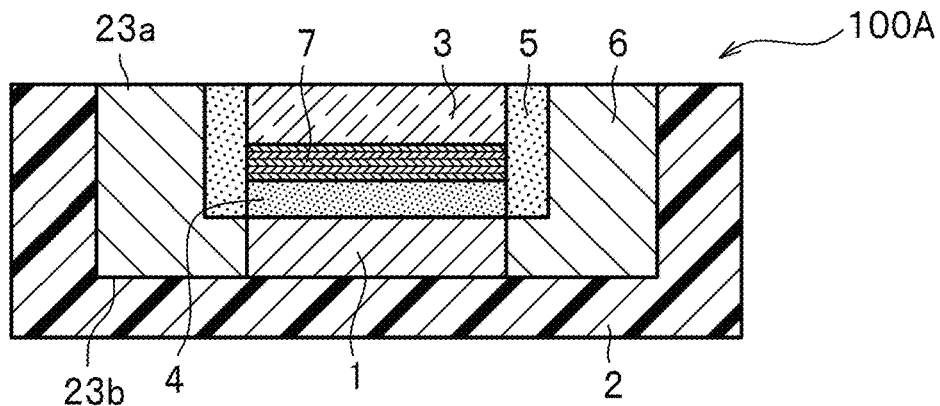
FIG. 2A is a cross-sectional view showing the configuration of a first modification of the light-emitting device according to the first embodiment.

FIG. 2A is a cross-sectional view showing the configuration of the first modification of the light-emitting device 100 according to the first embodiment. A description will be given of the light-emitting device 100A according to the first modification with reference to FIG. 2A. In the light-emitting device 100A according to the first modification, the light-emitting element 1 and the phosphor layer 4 are directly bonded to each other. In this configuration, the bonding member 8 is not interposed between the light-emitting element 1 and the phosphor layer 4, and thus the blue light emitted from the light-emitting element 1 is never interrupted by the bonding member 8, contributing to reducing unevenness in the light from the light-emitting device 100A.

Examples of the method for direct bonding include a surface activation bonding method, a hydroxyl group bonding method, and an atomic diffusion bonding method. The surface activation bonding method bonds bonding surfaces by treating the bonding surfaces in vacuum to facilitate chemical bonding. The hydroxyl group bonding method forms hydroxyl group on bonding surfaces by an atomic layer deposition method or the like to cause the hydroxy group on the bonding surfaces to bond with each other. The atomic diffusion bonding method forms a thin metal film having a film thickness corresponding to a one-atom layer and causes the bonding surfaces to be in contact with each other in vacuum or in an inert gas atmosphere, to bond metal atoms together. These direct bonding methods can be used to integrate the light-emitting element 1 and the phosphor layer 4 in an environment with a temperature close to the normal temperature range.

Second Modification

Figure 2B:
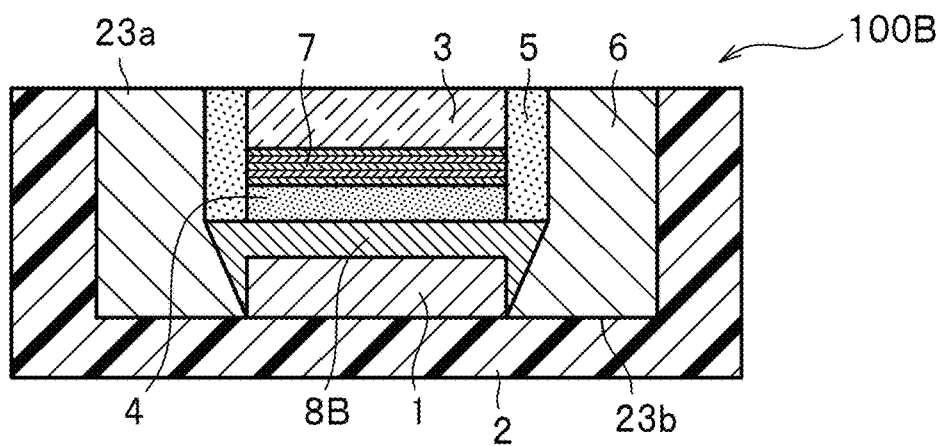
FIG. 2B is a cross-sectional view showing the configuration of a second modification of the light-emitting device according to the first embodiment.

FIG. 2B is a cross-sectional view showing the configuration of the second modification of the light-emitting device 100 according to the first embodiment. A description will be given of the light-emitting device 100B according to the second modification with reference to FIG. 2B. In the light-emitting device 100B according to the second modification, the bonding member 8B is disposed on the first surface and the third surfaces of the light-emitting element 1. The bonding member 8B is disposed also on the third surfaces of the light-emitting element 1 in a fillet-shape. This facilitates causing the blue light emitted by the light-emitting element 1 to enter the phosphor layer 4 and the cover layer 5. The bonding member 8B bonds the light-emitting element 1 to the phosphor layer 4 and further to the cover layer 5. With this structure, even when the area of the light-emitting element 1 is smaller than the area of the phosphor layer 4 in plan view, the blue light emitted by the light-emitting element 1 is efficiently caused to enter the phosphor layer 4 and the cover layer 5.

The fillet-shaped portion of the bonding member 8B, which are disposed on the third surfaces of the light-emitting element 1, has a triangular shape in cross-sectional view. This shape allows a large amount of blue light emitted by the light-emitting element 1 to be reflected by an interface between the bonding member 8B and the light-reflective member 6. This increases the light emission efficiency of the light-emitting device 100B, resulting in an increase in the luminance of light. The size of the fillet-shaped portion of the bonding member 8B is adjustable by the amount of the material of the bonding member 8B, and can be designed on the basis of the wettability and the viscosity of the bonding surfaces of the bonding member 8B interfacing with the light-emitting element 1, the phosphor layer 4, and the cover layer 5.

Third Modification

Figure 2C:
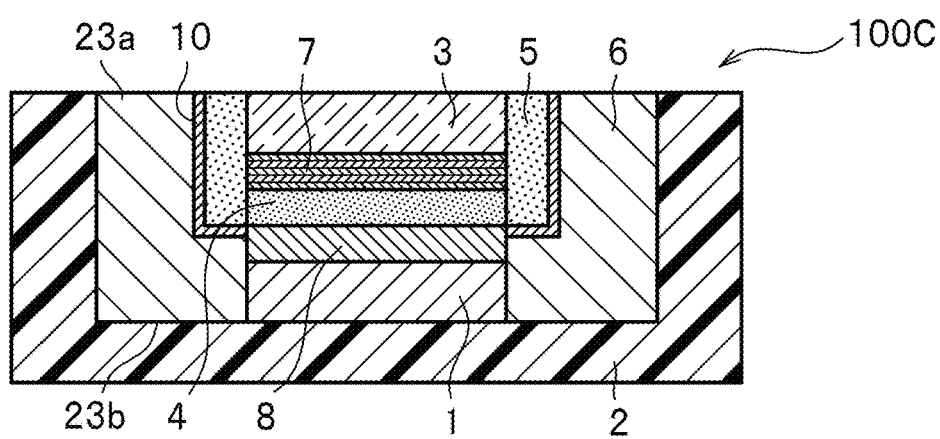
FIG. 2C is a cross-sectional view showing the configuration of a third modification of the light-emitting device according to the first embodiment.
Figure 3:
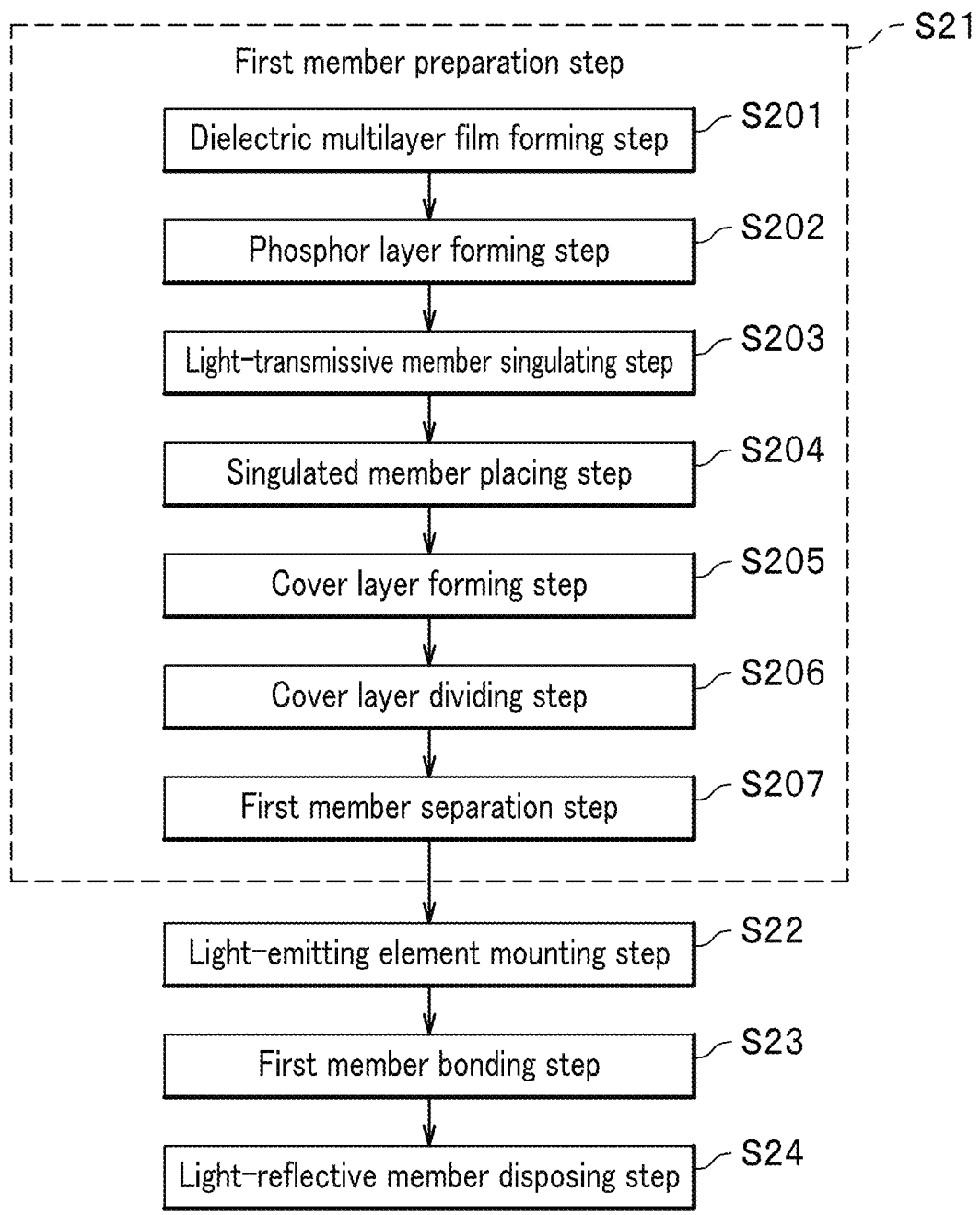
FIG. 3 is a flowchart of a method for manufacturing the light-emitting device according to the first embodiment.

FIG. 2C is a cross-sectional view showing the configuration of a third modification of the light-emitting device 100 according to the first embodiment. A description will be given of the light-emitting device 100C according to the third modification with reference to FIG. 2C.

In the light-emitting device 100C according to the third modification, a protection layer 10 is disposed between the cover layer 5 and the light-reflective member 6. The protection layer 10 efficiently reflects the yellow-red to red light emitted or presented by the cover layer 5 at a light-reflecting surface of the light-reflective member 6.

The protection layer 10 inhibits damage and degradation of the light-reflecting surface and improves the corrosion resistance of the light-reflective member 6

The protection layer 10 may also be disposed between the light-emitting element 1 and the light-reflective member 6 in addition to between the cover layer 5 and the light-reflective member 6.

The protection layer 10 is preferably made of a material having high light reflectivity, and more preferably made of a metal material having high corrosion resistance. Examples of the material for the protection layer 10 include Ni, Rh, Pt, Pd, Ru, Os, and Ir. The protection layer 10 preferably has a film thickness of 0.1 nm to 500 nm, and more preferably 10 nm to 200 nm. The protection layer 10 with a film thickness in those ranges improves light extraction efficiency of the light-emitting device 100C and protects the light-reflective member 6. Incidentally, in the present specification, when a member is described as having a first surface and a second surface opposite the first surface, and when the first surface corresponds to a front surface of the member, the second surface corresponds to a rear surface of the member.

Light-emitting Device Manufacturing Method

Next, a description will be given of a method for manufacturing the light-emitting device according to the first embodiment with reference to the FIGS. 3 to 6C. Note that the order of some manufacturing steps is not limited and may be changed.

The method for manufacturing the light-emitting device according to the first embodiment include a first member preparation step S21, a light-emitting element mounting step S22, a first member bonding step S23, and a light-reflective member disposing step S24. The first member preparation step S21 includes a dielectric multilayer film forming step S201, a phosphor layer forming step S202, a light-transmissive member singulating step S203, a singulated member placing step S204, a cover layer forming step S205, a cover layer dividing step S206, and a first member separation step S207.

The first member preparation step S21 prepares first members 211 each including a light-transmissive member 3 having a first surface, a second surface opposite the first surface, and third surfaces each contiguous with the first surface and the second surface; a phosphor layer 4 disposed opposite to the second surface of the light-transmissive member 3; and a cover layer 5 disposed on lateral surfaces of the phosphor layer 4 and the third surfaces of the light-transmissive member 3.

Figure 4A:
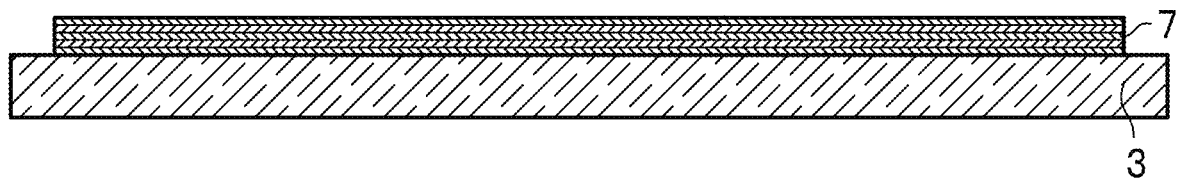
FIG. 4A is a cross-sectional view illustrating a dielectric multilayer film forming step of the method for manufacturing the light-emitting device according to the first embodiment.

Hereinafter, the first member preparation step S21 is specifically described. As shown in FIG. 4A, the dielectric multilayer film forming step S201 forms a dielectric multilayer film 7 on a light-transmissive member 3. In the dielectric multilayer film forming step S201, the dielectric multilayer film 7 is formed on the light-transmissive member 3 as a film having at least two kinds of dielectric layers, by sputtering or the like.

Figure 4B:
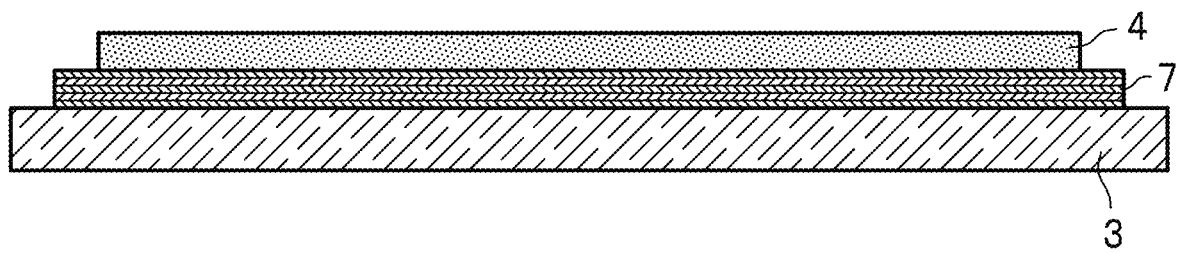
FIG. 4B is a cross-sectional view illustrating a phosphor layer forming step of the method for manufacturing the light-emitting device according to the first embodiment.

As shown in FIG. 4B, the phosphor layer forming step S202 forms a phosphor layer 4 on the dielectric multilayer film 7. In the phosphor layer forming step S202, the phosphor layer 4 is formed on the dielectric multilayer film 7 by applying a resin containing red phosphor by screen printing or the like.

Figure 4C:
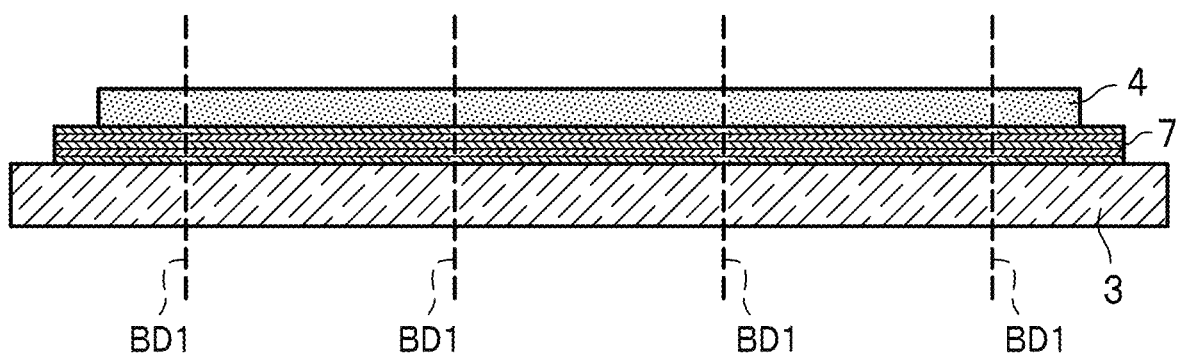
FIG. 4C is a cross-sectional view illustrating a light-transmissive member singulating step of the method for manufacturing the light-emitting device according to the first embodiment.

As shown in FIG. 4C, the light-transmissive member singulating step S203 singulates the light-transmissive member 3, the dielectric multilayer film 7, and the phosphor layer 4 together into intermediate workpieces. In the light-transmissive member singulating step S203, the light-transmissive member 3, the dielectric multilayer film 7, and the phosphor layer 4 are divided together along singulation lines BD1 by blade dicing or laser dicing.

Figure 5A:
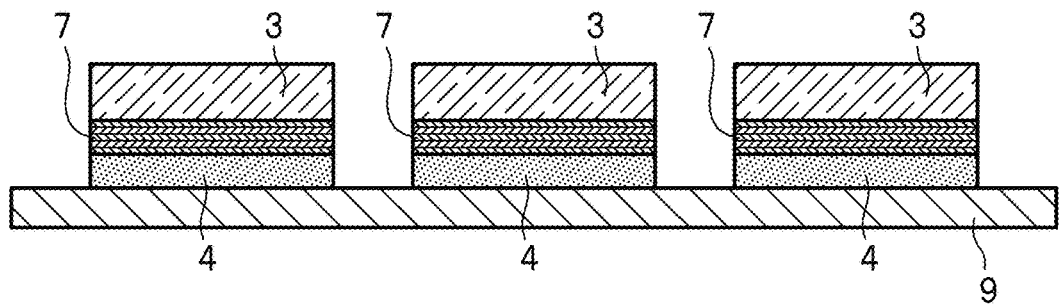
FIG. 5A is a cross-sectional view illustrating a singulated member placing step of the method for manufacturing the light-emitting device according to the first embodiment.

As shown in FIG. 5A, the singulated member placing step S204 puts the intermediate workpieces on a thermal release sheet 9 at predetermined intervals. In the singulated member placing step S204, the intermediate workpieces are put on the thermal release sheet 9 at predetermined intervals, which are appropriately set taking into account the width or the like of a cover layer 5 to be formed in the next step. Here, the width of the cover layer 5 means the thickness of the cover layer 5 in a direction perpendicular to the third surfaces of the light-emitting element 1.

The thermal release sheet 9 has adhesiveness to adhere to an object at normal temperatures, and loses the adhesiveness when heated or irradiated by ultraviolet radiation to release the object. The thermal release sheet 9 keeps adhesiveness during the period in which steps form the singulated member placing step S204 to the cover layer dividing step S206 are carried out, and loses the adhesiveness when the first member separation step S207 is carried out. When the thermal release sheet 9 loses the adhesiveness by being heated, the release temperature of the thermal release sheet 9 is preferably higher than the curing temperature of the thermosetting resin used as the matrix material of the phosphor layer 4 and the cover layer 5.

Figure 5B:
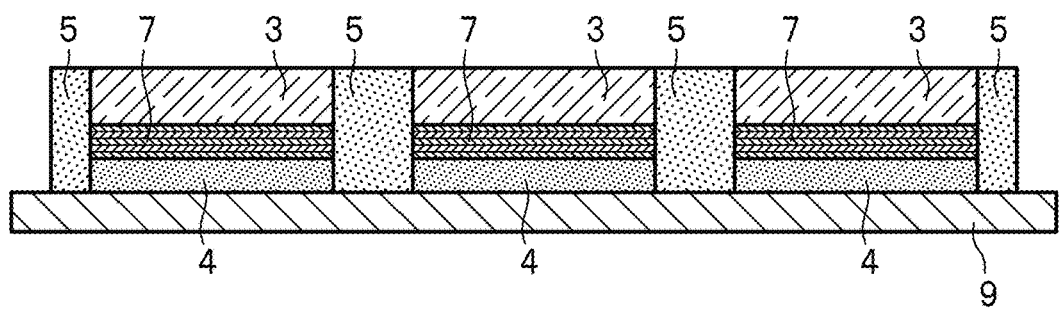
FIG. 5B is a cross-sectional view illustrating a cover layer forming step of the method for manufacturing the light-emitting device according to the first embodiment.

As shown in FIG. 5B, the cover layer forming step S205 forms a cover layer 5 between the intermediate workpieces. The cover layer forming step S205 forms the cover layer 5 by filling a resin containing red phosphor or red pigment between the intermediate workpieces by, for example, potting using a dispenser. The cover layer 5 is not formed over the light-transmissive member 3.

Figure 5C:
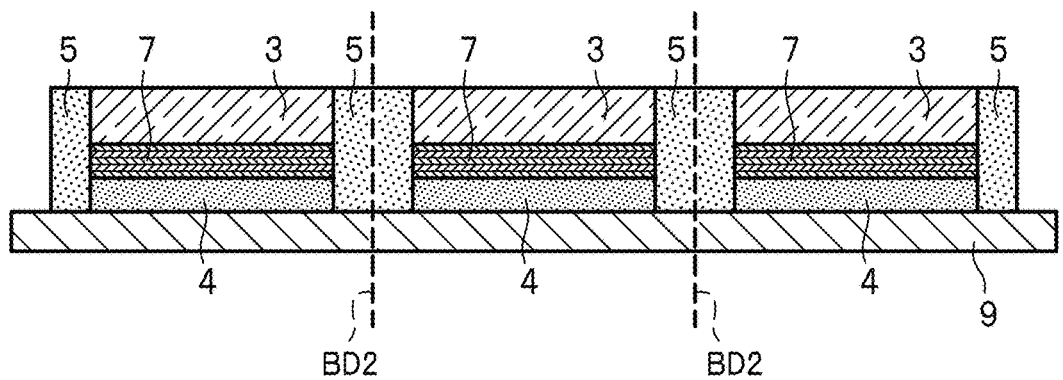
FIG. 5C is a cross-sectional view illustrating a cover layer dividing step of the method for manufacturing the light-emitting device according to the first embodiment.

As shown in FIG. 5C, the cover layer dividing step S206 divides the cover layer 5. The cover layer dividing step S206 produces first members 211 on the thermal release sheet 9 by dividing the cover layer 5 along division lines BD2 by, for example, blade dicing or laser dicing. Preferably, the division lines BD2 are each set at the center of an exposed surface of the corresponding exposed cover layer 5 in plan view.

Figure 5D:
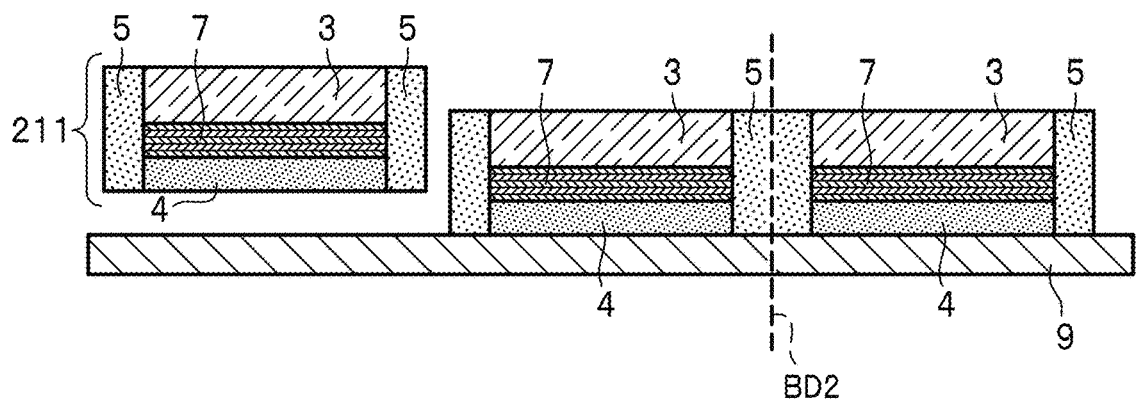
FIG. 5D is a cross-sectional view illustrating a first member separation step of the method for manufacturing the light-emitting device according to the first embodiment.

As shown in FIG. 5D, the first member separation step S207 separates the first members 211 from the thermal release sheet 9. In the first member separation step S207, the thermal release sheet 9 loses adhesiveness by being heated or irradiated with ultraviolet radiation to separate the first members 211. The foregoing steps complete the first member preparation step S21.

Figure 6A:
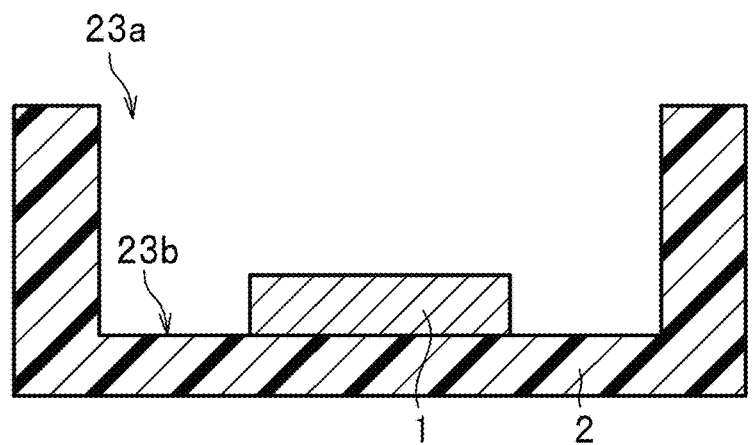
FIG. 6A is a cross-sectional view illustrating a light-emitting element mounting step of the method for manufacturing the light-emitting device according to the first embodiment.

As shown in FIG. 6A, the light-emitting element mounting step S22 mounts a light-emitting element 1 on a base 2 having a recess 23a, for each of the first members 211. Preferably, in the light-emitting element mounting step S22, each light-emitting element 1 is mounted by flip-chip mounting using reflow soldering.

Figure 6B:
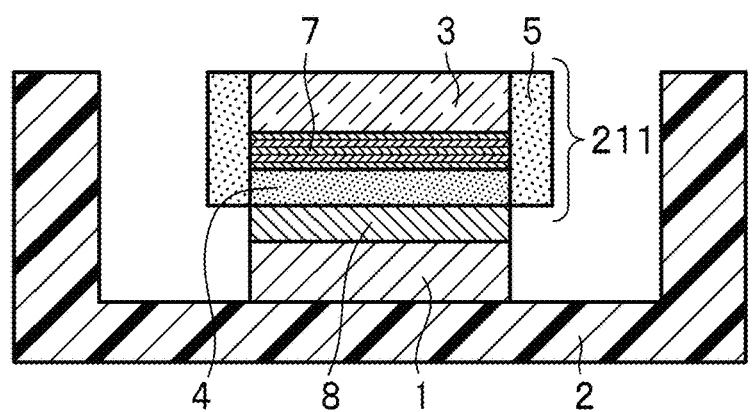
FIG. 6B is a cross-sectional view illustrating a first member bonding step of the method for manufacturing the light-emitting device according to the first embodiment.

As shown in FIG. 6B, the first member bonding step S23 bonds each light-emitting element 1 and the corresponding first member 211 together. In the first member bonding step S23, a bonding member 8 is formed on a bonding surface of each light-emitting element 1 and/or a bonding surface of the corresponding first member 211 by an application method or the like, and those bonding surfaces are bonded to each other via the bonding member 8.

Figure 6C:
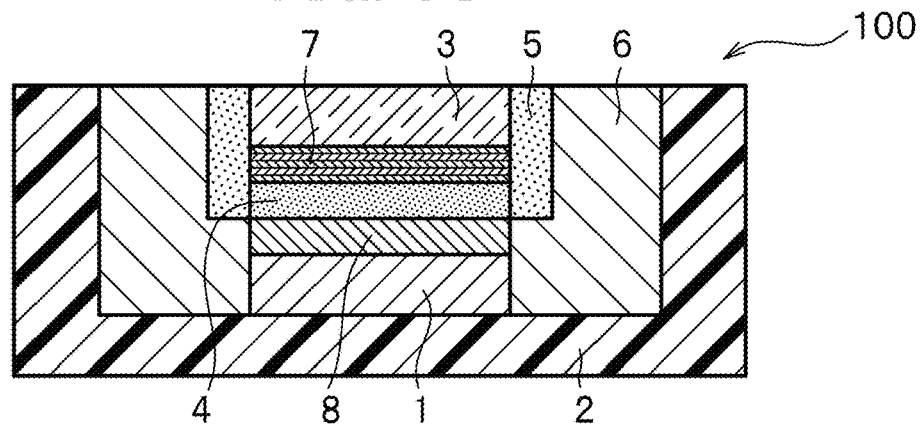
FIG. 6C is a cross-sectional view illustrating a light-reflective member disposing step of the method for manufacturing the light-emitting device according to the first embodiment.
Figure 7:
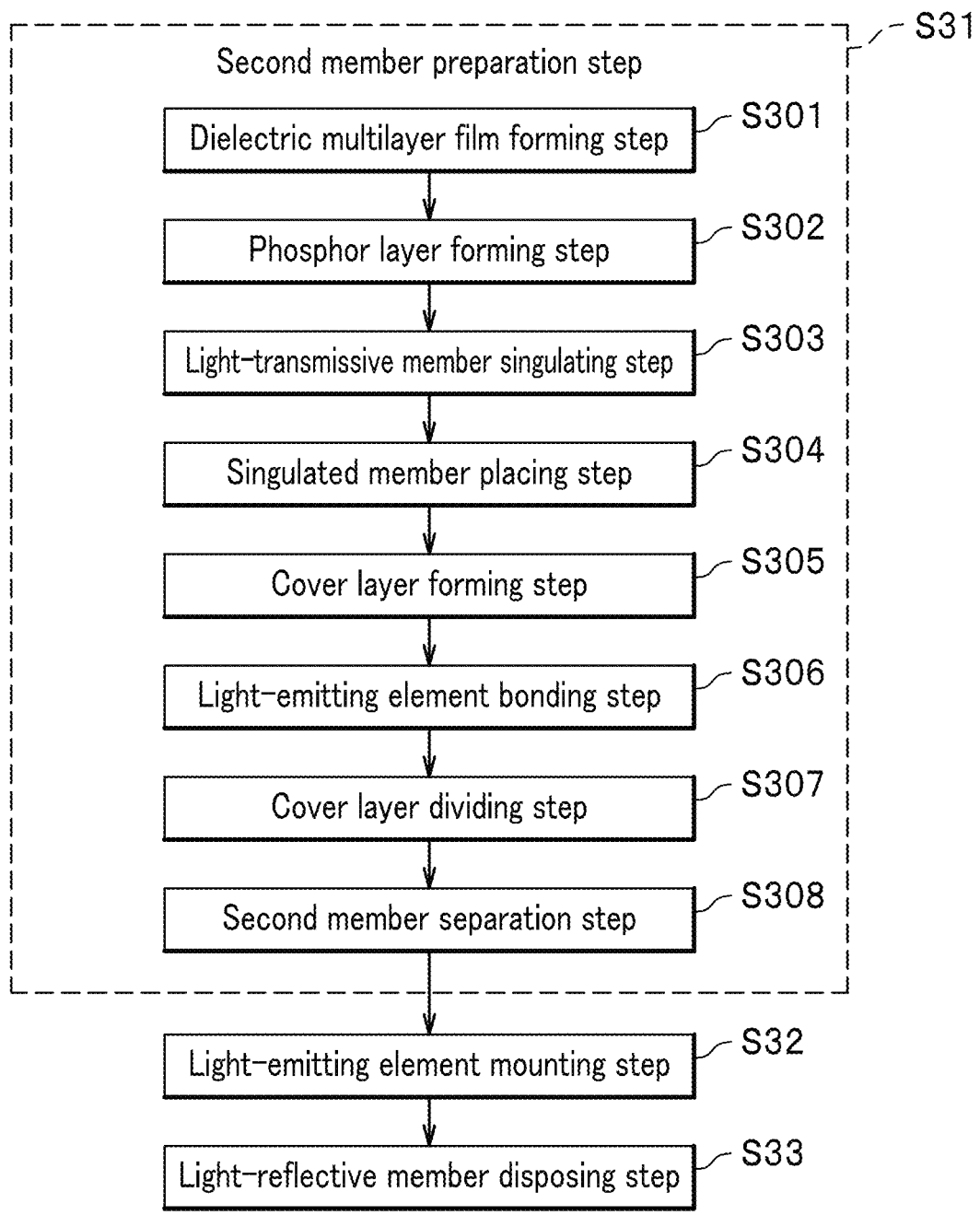
FIG. 7 is a flowchart of a modification of the method for manufacturing the light-emitting device according to the first embodiment.

As shown in FIG. 6C, the light-reflective member disposing step S24 provides a light-reflective member 6 in the recess 23a of each base 2 so as to cover at least a portion of side surfaces of the cover layer 5 of the first member 211 in the base 2. In the light-reflective member disposing step S24, the light-reflective member 6 in the recess 23a of each base 2 is formed by: filling the recess 23a with an uncured resin in which light-reflective substance is dispersed, by, for example, potting using a dispenser; and then heating the resin at a predetermined temperature for a predetermined period of time by a heating device such as a heater or a reflow oven. The light-reflective member 6 is not formed over the light-transmissive member 3 and the cover layer 5 of each first member 211.

When the base 2 does not have the recess 23a and have a flat plate shape, the light-reflective member 6 may be formed by, in order, placing a frame body so as to surround each light-emitting element 1, filling an uncured resin in which light-reflective substance is dispersed in the frame body, heating the resin at a predetermined temperature for a predetermined period of time, and removing the frame body. Carrying out the above-described steps manufactures light-emitting devices 100. The steps need not necessarily be carried out in the above described order. For example, the light-emitting element mounting step S22 may be first carried out and then the first member preparation step S21 may be carried out.

Modification

A description will be given of a modification of the method for manufacturing a light-emitting device according to the first embodiment with reference to the FIGS. 7 to 10. In the method for manufacturing a light-emitting device according to the first embodiment, the intermediate workpieces are put on the thermal release sheet 9 with the phosphor layer 4 located at the lowermost portion of the intermediate workpieces to form the first members 211. In contrast, in the modification of the method for manufacturing a light-emitting device according to the first embodiment, the intermediate workpieces are put on the thermal release sheet 9 with the light-transmissive member 3 located at the lowermost portion of the intermediate workpieces to form second members 311. Note that the order of some manufacturing steps of the second modification is not limited and may be changed.

A modification of the light-emitting device manufacturing method according to the first embodiment include a second member preparation step S31, a light-emitting element mounting step S32, and a light-reflective member disposing step S33. The second member preparation step S31 includes a dielectric multilayer film forming step S301, a phosphor layer forming step S302, a light-transmissive member singulating step S303, a singulated member placing step S304, a cover layer forming step S305, a light-emitting element bonding step S306, a cover layer dividing step S307, and a second member separation step S308.

The second member preparation step S31 prepares a second member including a light-transmissive member 3 having a first surface, a second surface opposite the first surface, and third surfaces each contiguous with the first surface and the second surface; a phosphor layer 4 disposed opposite to the second surface of the light-transmissive member 3; and a cover layer 5 disposed on lateral surfaces of the phosphor layer 4 and the third surfaces of the light-transmissive member 3, and a light-emitting element 1 disposed opposite to the phosphor layer 4.

Hereinafter, the second member preparation step S31 is specifically described. As to part of the manufacturing method that is common with the above-described method for manufacturing a light-emitting device according to the first embodiment, duplicative description is omitted.

Figure 8A:
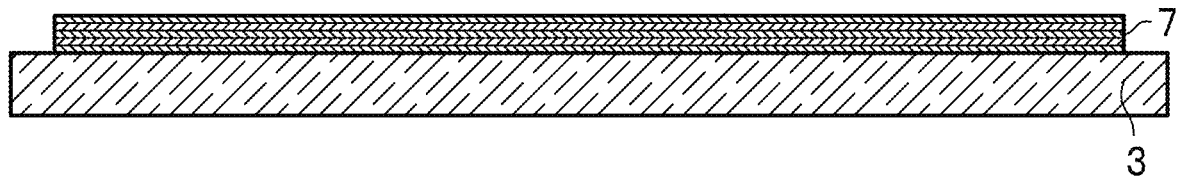
FIG. 8A is a cross-sectional view illustrating a dielectric multilayer film forming step of the modification of the method for manufacturing the light-emitting device according to the first embodiment.
Figure 8B:
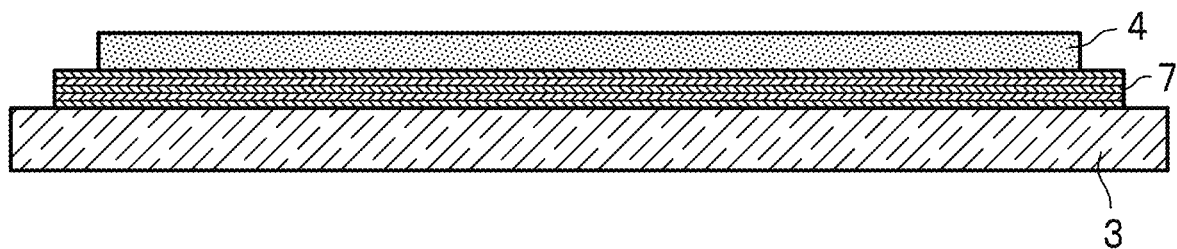
FIG. 8B is a cross-sectional view illustrating a phosphor layer forming step of the modification of the method for manufacturing the light-emitting device according to the first embodiment.
Figure 8C:
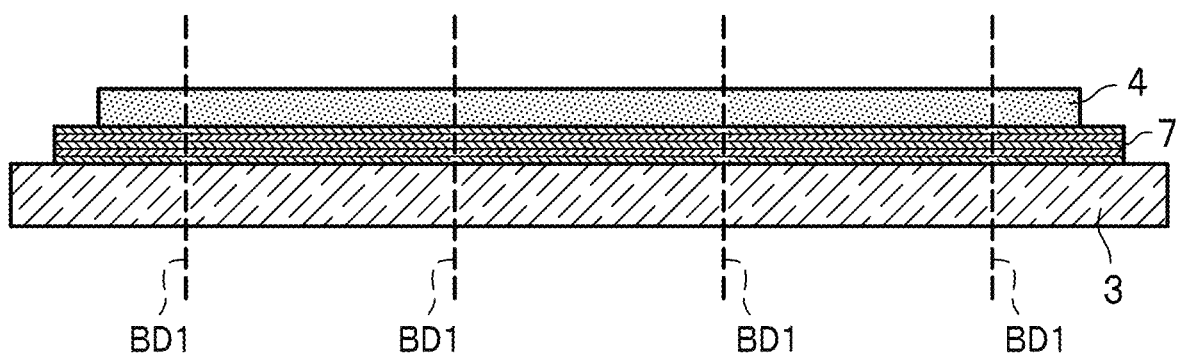
FIG. 8C is a cross-sectional view illustrating a light-transmissive member singulating step of the modification of the method for manufacturing the light-emitting device according to the first embodiment.

As the steps S301 to S303 shown in FIGS. 8A to 8C are the same as the steps S201 to S203 shown in FIGS. 4A to 4C, the above description as to the steps S201 to S203 will apply to the steps S301 to S303.

Figure 9A:
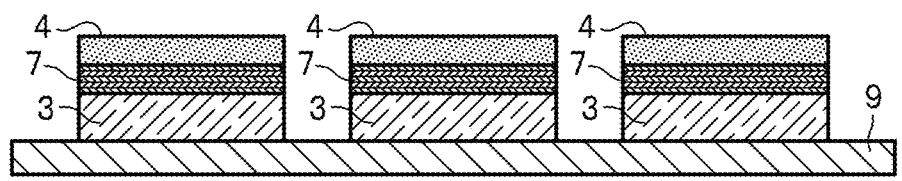
FIG. 9A is a cross-sectional view illustrating a singulated member placing step of the modification of the method for manufacturing the light-emitting device according to the first embodiment.

As shown in FIG. 9A, the singulated member placing step S304 puts the intermediate workpieces on a thermal release sheet 9 at predetermined intervals with the light-transmissive member 3 located at the lowermost portion of the intermediate workpieces. The thermal release sheet 9 keeps adhesiveness during the period in which the steps from the singulated member placing step S304 to the cover layer dividing step S307 are carried out, but loses the adhesiveness when the second member separation step S308 is carried out.

Figure 9B:
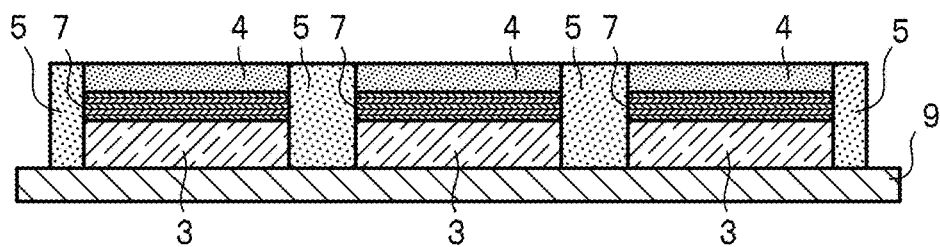
FIG. 9B is a cross-sectional view illustrating a cover layer forming step of the modification of the method for manufacturing the light-emitting device according to the first embodiment.

As shown in FIG. 9B, the cover layer forming step S305 forms the cover layer 5 between the intermediate workpieces. The cover layer forming step S305 forms the cover layer 5 by filling a resin containing red phosphor or red pigment between the intermediate workpieces by, for example, potting using a dispenser. The cover layer 5 is not formed over the phosphor layer 4.

Figure 9C:
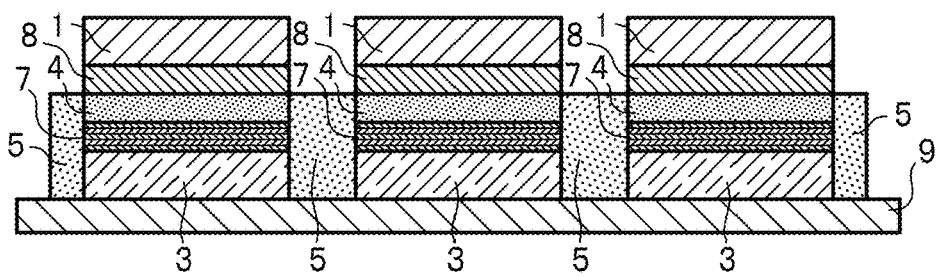
FIG. 9C is a cross-sectional view illustrating a light-emitting element bonding step of the modification of the method for manufacturing the light-emitting device according to the first embodiment.

As shown in FIG. 9C, the light-emitting element bonding step S306 bonds a light-emitting element 1 on the phosphor layer 4 of each of the intermediate workpieces. In the light-emitting element bonding step S306, a bonding member 8 is formed on a bonding surface of the light-emitting element 1 and/or a bonding surface of the phosphor layer 4 by an application method or the like, and those bonding surfaces are bonded to each other via the bonding member 8, thereby the light-emitting element 1 is bonded on the phosphor layer 4.

Figure 9D:
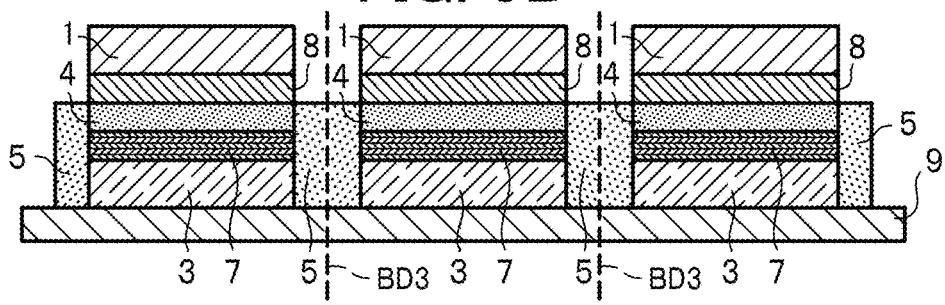
FIG. 9D is a cross-sectional view illustrating a cover layer dividing step of the modification of the method for manufacturing the light-emitting device according to the first embodiment.

As shown in FIG. 9D, the cover layer dividing step S307 divides the cover layer 5. The cover layer dividing step S307 produces second members 311 on the thermal release sheet 9 by dividing the cover layer 5 along division lines BD3 by, for example, blade dicing or laser dicing. Preferably, the division lines BD3 are each set at the center of an exposed surface of the corresponding cover layer 5 in plan view.

Figure 9E:
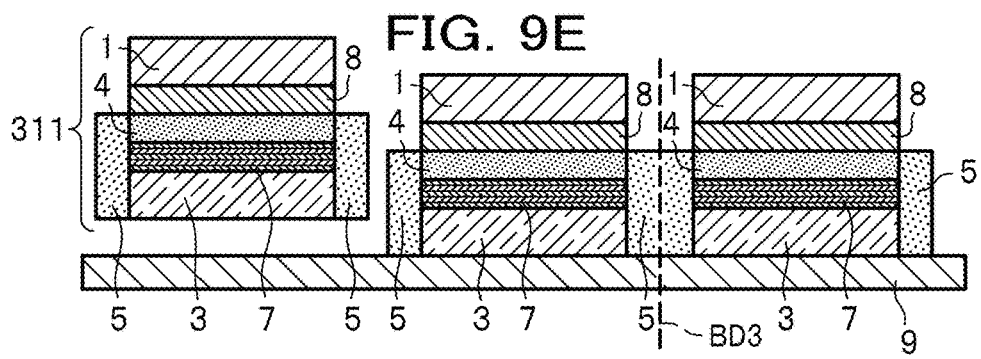
FIG. 9E is a cross-sectional view illustrating a second member separation step of the modification of the method for manufacturing the light-emitting device according to the first embodiment.

As shown in FIG. 9E, the second member separation step S308 separates the second members 311 from the thermal release sheet 9. In the second member separation step S308, the thermal release sheet 9 loses adhesiveness by being heated or irradiated with ultraviolet radiation to separate the second members 311. The foregoing steps complete the second member preparation step S31.

Figure 10A:
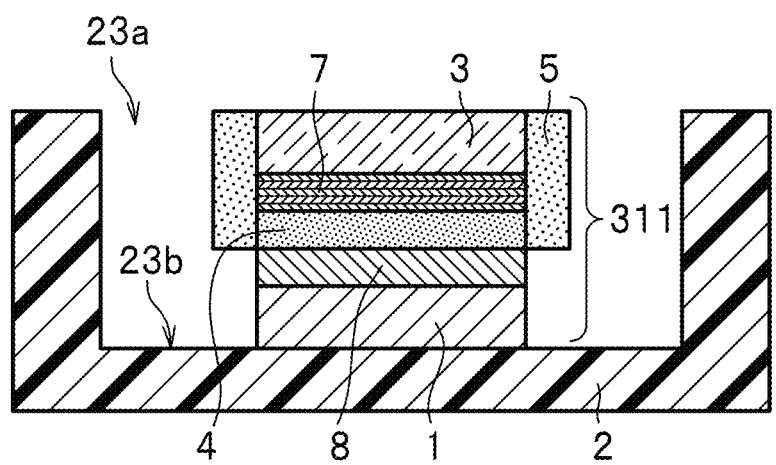
FIG. 10A is a cross-sectional view illustrating a light-emitting element mounting step of the modification of the method for manufacturing the light-emitting device according to the first embodiment.

As shown in FIG. 10A, the light-emitting element mounting step S32 mounts the light-emitting element 1 of each second member 311 on a base 2 having a recess 23a.

In the light-emitting element mounting step S32, the second member 311 is directly disposed on the base 2 having the recess 23a with the light-emitting element 1 located at the lowermost portion of the second member 311.

In the light-emitting device according to the first embodiment, one light-emitting element 1 is mounted solely on each base 2 and then the light-emitting element 1 and one first member 211 are bonded to each other. In contrast, in the modification of the method for manufacturing a light-emitting device according to the first embodiment, one second member 311 is directly mounted on one base 2.

Figure 10B:
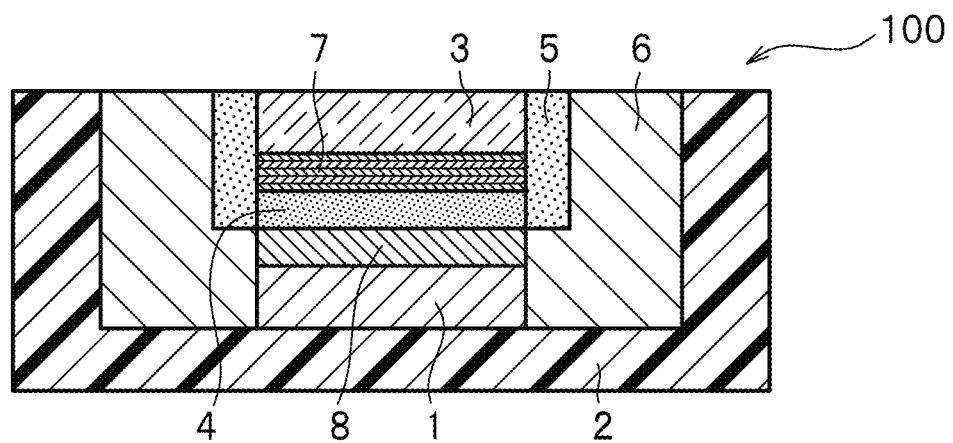
FIG. 10B is a cross-sectional view illustrating a light-reflective member disposing step of the modification of the method for manufacturing the light-emitting device according to the first embodiment.

As shown in FIG. 10B, the light-reflective member disposing step S33 provides a light-reflective member 6 in the recess 23a of each base 2 so as to cover at least a portion of side surfaces of the cover layer 5 of the second member in the base 2. In the light-reflective member disposing step S33, the light-reflective member 6 in the recess 23a of each base 2 is formed by: filling the recess 23a with an uncured resin in which light-reflective substance is dispersed, by, for example, potting using a dispenser; and then heating the resin at a predetermined temperature for a predetermined period of time by a heating device such as a heater or a reflow oven. The light-reflective member 6 is not formed over the light-transmissive member 3 and the cover layer 5 of each second member 311. Carrying out the above-described steps also manufactures light-emitting devices 100.

Second Embodiment

Configuration of Light-emitting Device

Next, a description will be given of a light-emitting device 200 according to a second embodiment with reference to FIGS. 11A and 11B. As to portions of the second embodiment that is common with the above-described first embodiment, duplicative description is omitted.

Figure 11A:
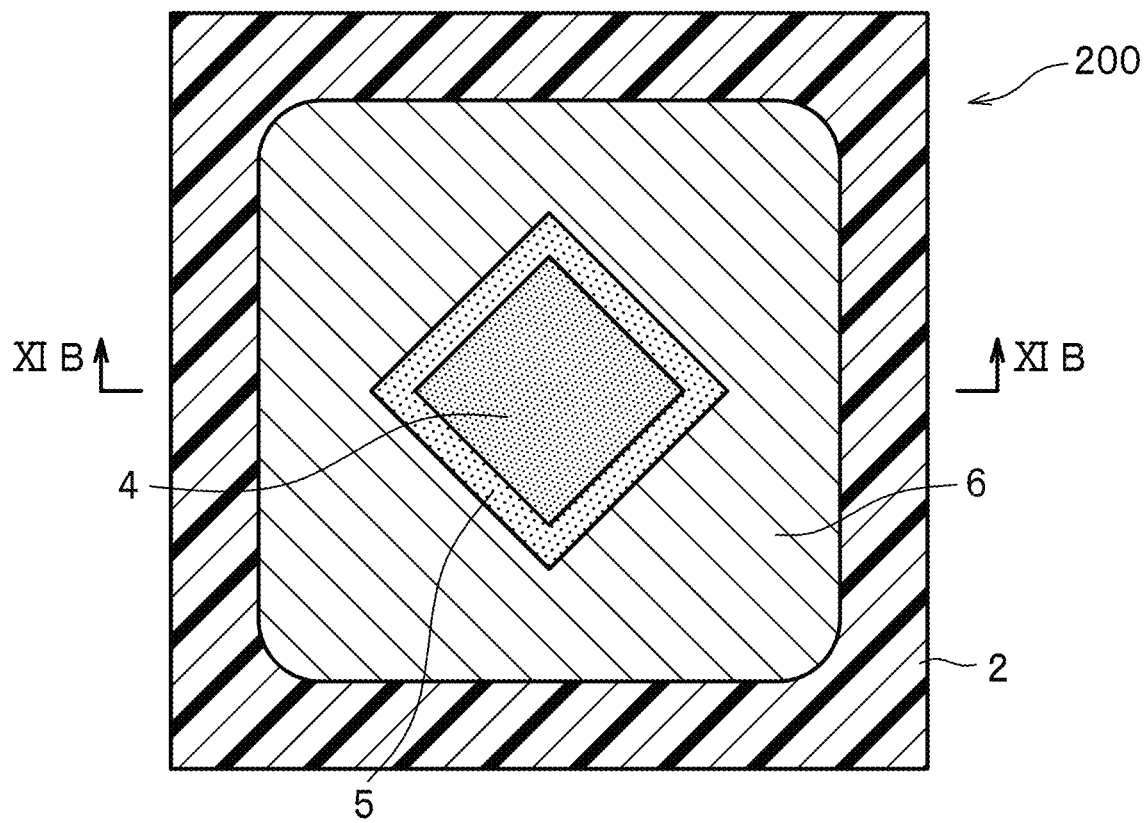
FIG. 11A is a plan view showing the configuration of the light-emitting device according to the second embodiment.
Figure 11B:
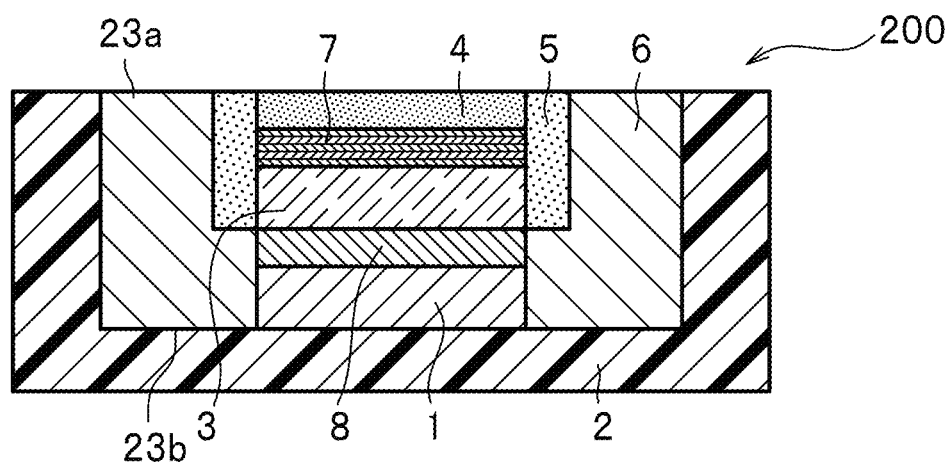
FIG. 11B is a cross-sectional view taken along line XIB-XIB in FIG. 11A, showing the configuration of the light-emitting device according to the second embodiment.
Figure 12:
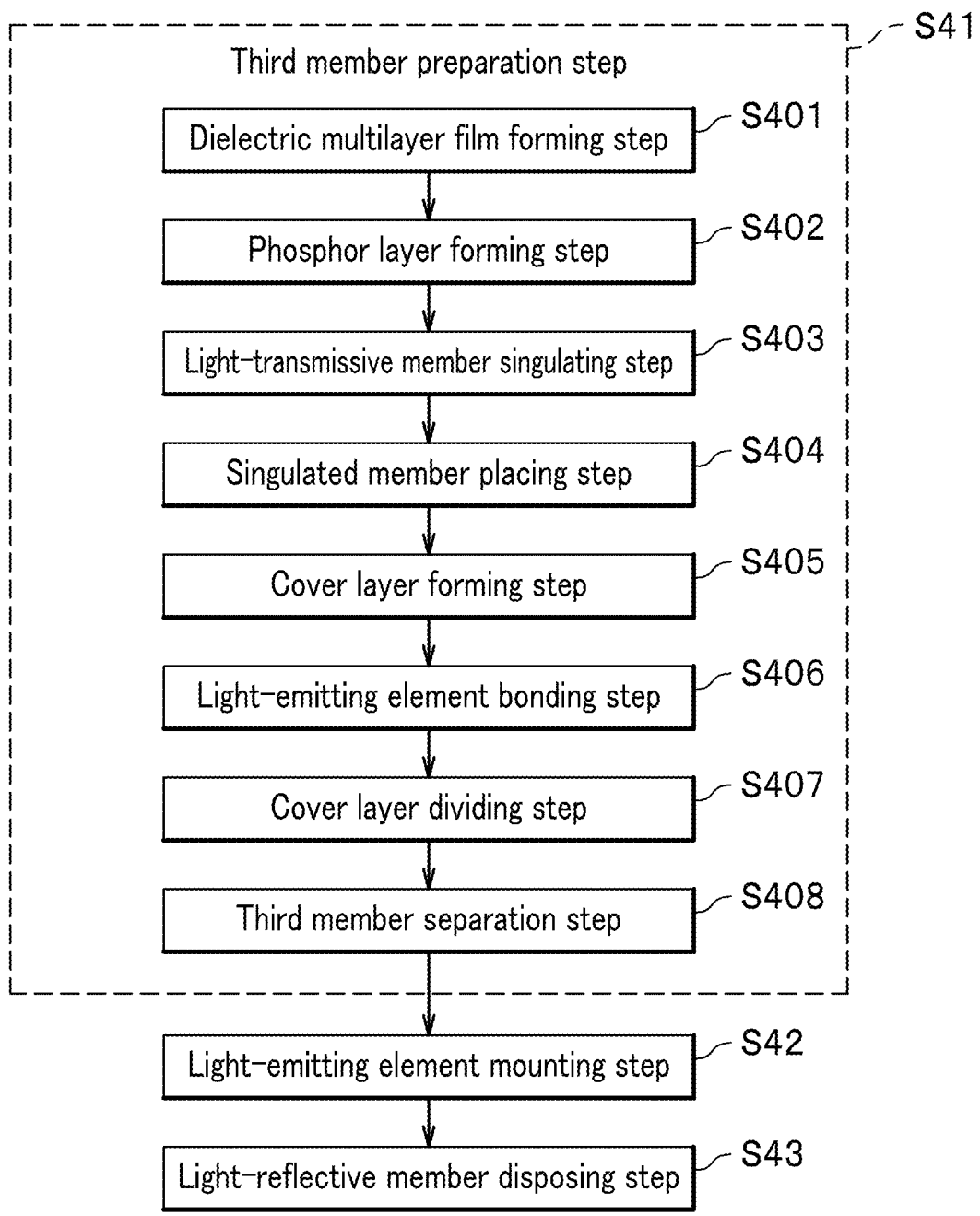
FIG. 12 is a flowchart of a method for manufacturing the light-emitting device according to the second embodiment.

FIG. 11A is a plan view showing the configuration of a light-emitting device according to the second embodiment. FIG. 11B is a cross-sectional view taken along line XIB-XIB of FIG. 11A and showing the configuration of the light-emitting device according to the second embodiment.

The light-emitting device 200 includes: a light-transmissive member 3 having a first surface, a second surface opposite the first surface, and third surfaces each contiguous with the first surface and the second surface; a phosphor layer 4 disposed opposite to the first surface of the light-transmissive member 3; a cover layer 5 disposed on lateral surfaces of the phosphor layer 4 and the third surfaces of the light-transmissive member 3; a light-emitting element 1 disposed opposite to the light-transmissive member 3; and a light-reflective member 6 covering at least a portion of the cover layer 5.

The light-emitting element 1 has a first surface, a second surface opposite the first surface, and third surfaces each contiguous with the first surface and the second surface, wherein the first surface, the second surface, and the third surfaces respectively correspond to an upper surface, a lower surface, and lateral surfaces of the light-emitting element 1. The light-emitting element 1 is disposed such that: the first surface of the light-emitting element 1 is opposite to the light-transmissive member 3; the second surface of the light-emitting element 1 is disposed on a bottom surface 23b of a recess 23a of the base 2; and the third surfaces of the light-emitting element 1 are surrounded and covered by the light-reflective member 6.

The light-transmissive member 3 has a first surface, a second surface opposite the first surface, and third surfaces each contiguous with the first surface and the second surface, wherein the first surface, the second surface, and the third surfaces respectively correspond to an upper surface, a lower surface, and lateral surfaces of the light-transmissive member 3. The light-transmissive member 3 is disposed such that: the first surface of the light-transmissive member 3 is opposite to the phosphor layer 4 with a dielectric multilayer film 7 interposed therebetween; the second surface of the light-transmissive member 3 is opposite to the light-emitting element 1; and the third surfaces of the light-transmissive member 3 are surrounded and covered by the cover layer 5.

The phosphor layer 4 is disposed opposite to the first surface of the light-transmissive member 3 and absorbs at least a portion of the blue light emitted by the light-emitting element 1 and emits yellow-red to red light.

The cover layer 5 is disposed in a rectangular loop shape to surround and cover the lateral surfaces of the phosphor layer 4, the lateral surfaces of the dielectric multilayer film 7, and the third surfaces of the light-transmissive member 3. The cover layer 5 absorbs at least a portion of the blue light emitted by the light-emitting element 1 and emits yellow-red to red light. The cover layer 5 also absorbs blue light that has passed through the dielectric multilayer film 7. Disposing the cover layer 5 so as to cover from the lateral surfaces of the phosphor layer 4 to the third surfaces of the light-transmissive member 3 increases the amount of blue light converted to yellow-red to red light. With this configuration, even when a large amount of blue light passes through the dielectric multilayer film 7 due to a great angle of incidence to the dielectric multilayer film 7, the light-emitting device 200 has small light leakage from the light-emitting element 1. Incidentally, the angle of incidence is defined in the range of 0° to 90°.

The light-reflective member 6 is disposed so as to cover at least a portion of the cover layer 5. In the accompanied drawings, the light-reflective member 6 covers outer lateral surfaces and lower surface of the cover layer 5, but does not cover the upper surface of the cover layer 5. The light-reflective member 6 serves to increase the light extraction efficiency of the light-emitting device 200 by efficiently reflecting the yellow-red to red light emitted or presented by the cover layer 5.

The dielectric multilayer film 7 is disposed between the light-transmissive member 3 and the phosphor layer 4 and causes the blue light emitted by the light-emitting element 1 to enter the phosphor layer 4 or the cover layer 5 efficiently.

The bonding member 8 bonds the light-emitting element 1 to the light-transmissive member 3. Preparing the bonding member 8 with the same material as that of the light-transmissive member 3 results in a small difference in the refractive index between the light-transmissive member 3 and the bonding member 8, and thus causes a large amount of blue light emitted from the light-emitting element 1 to enter the phosphor layer 4 or the cover layer 5, resulting in an increase in the light extraction efficiency of the light-emitting device 200.

As described, in the light-emitting device 200 according to the second embodiment, the cover layer 5 is disposed on the lateral surfaces of the phosphor layer 4 and the third surfaces of the light-transmissive member 3. With this configuration, the amount of light leakage from the light-emitting element 1 is small even at an oblique angle to the light-emitting device 200, allowing the light-emitting device 200 to display uniform red color independent of the viewing angle.

Light-emitting Device Manufacturing Method

Next, a description will be given of a method for manufacturing a light-emitting device according to the second embodiment with reference to the FIGS. 12 to 15B. Note that the order of some manufacturing steps is not limited and may be changed.

The method for manufacturing a light-emitting device according to the second embodiment includes a third member preparation step S41, a light-emitting element mounting step S42, and a light-reflective member disposing step S43. The third member preparation step S41 includes a dielectric multilayer film forming step S401, a phosphor layer forming step S402, a light-transmissive member singulating step S403, a singulated member placing step S404, a cover layer forming step S405, a light-emitting element bonding step S406, a cover layer dividing step S407, and a third member separation step S408.

The third member preparation step S41 prepares a third member including a light-transmissive member 3 having a first surface, a second surface opposite the first surface, and third surfaces each contiguous with the first surface and the second surface; a phosphor layer 4 disposed opposite to the first surface of the light-transmissive member 3; a cover layer 5 disposed on lateral surfaces of the phosphor layer 4 and the third surfaces of the light-transmissive member 3; and a light-emitting element 1 disposed opposite to the light-transmissive member 3.

Hereinafter, the third member preparation step S41 is specifically described. As to part of the manufacturing method that is common with the above-described method for manufacturing a light-emitting device according to the first embodiment or the modification thereof described above, duplicative description is omitted.

Figure 13A:
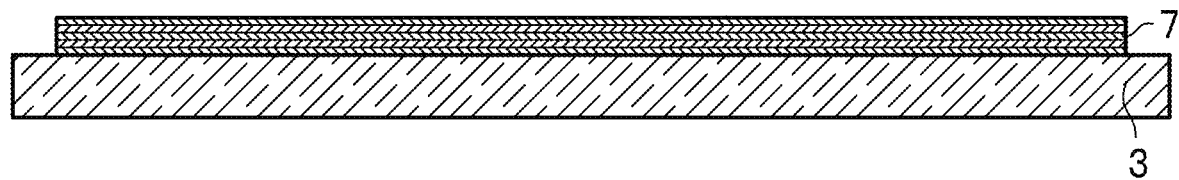
FIG. 13A is a cross-sectional view illustrating a dielectric multilayer film forming step of the method for manufacturing the light-emitting device according to the second embodiment.
Figure 13B:
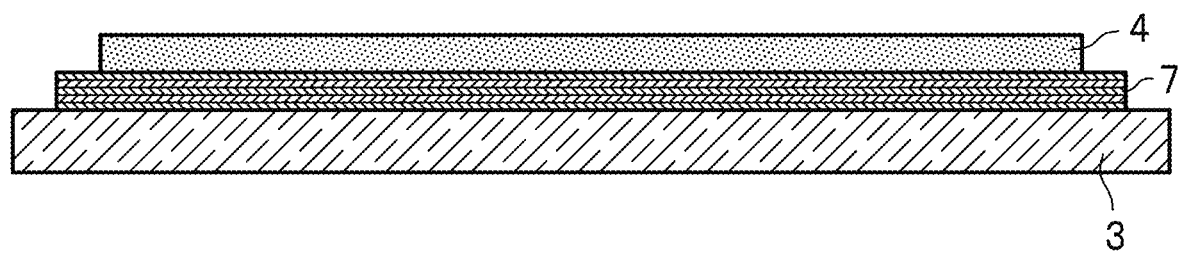
FIG. 13B is a cross-sectional view illustrating a phosphor layer forming step of the method for manufacturing the light-emitting device according to the second embodiment.
Figure 13C:
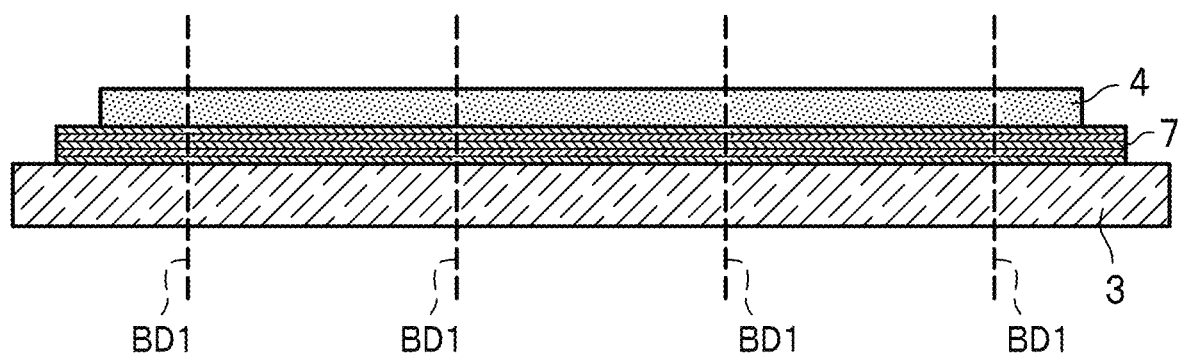
FIG. 13C is a cross-sectional view illustrating a light-transmissive member singulating step of the method for manufacturing the light-emitting device according to the second embodiment.

The steps S401 to S403 shown in FIGS. 13A to 13C are the same as the steps S201 to S203 shown in FIGS. 4A to 4C, the above description as to the steps S201 to S203 will apply to the steps S401 to S403.

Figure 14A:
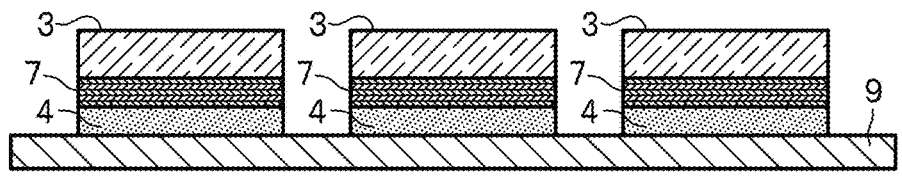
FIG. 14A is a cross-sectional view illustrating a singulated member placing step of the method for manufacturing the light-emitting device according to the second embodiment.

As shown in FIG. 14A, the singulated member placing step S404 puts the intermediate workpieces on a thermal release sheet 9 at predetermined intervals with the phosphor layer 4 located at the lowermost portion of the intermediate workpieces. The thermal release sheet 9 keeps adhesiveness during the period in which the steps from the singulated member placing step S404 to the cover layer dividing step S407 are carried out, but loses the adhesiveness when the third member separation step S408 is carried out.

Figure 14B:
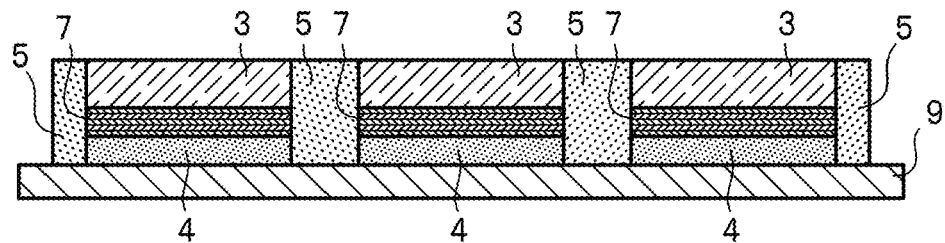
FIG. 14B is a cross-sectional view illustrating a cover layer forming step of the method for manufacturing the light-emitting device according to the second embodiment.

As shown in FIG. 14B, the cover layer forming step S405 forms the cover layer 5 between the intermediate workpieces. The cover layer forming step S405 forms the cover layer 5 by filling a resin containing red phosphor or red pigment between the intermediate workpieces by, for example, potting using a dispenser. The cover layer 5 is not formed over the light-transmissive member 3.

Figure 14C:
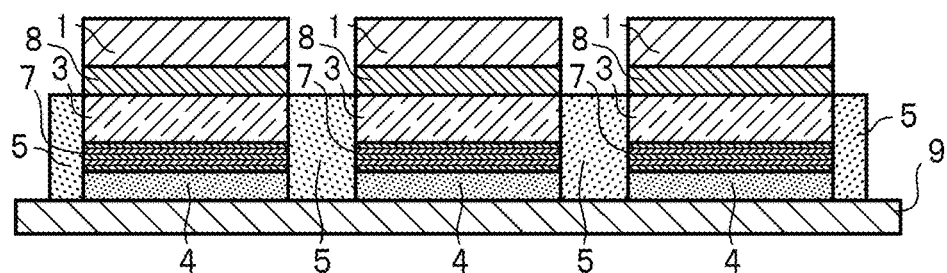
FIG. 14C is a cross-sectional view illustrating a light-emitting element bonding step of the method for manufacturing the light-emitting device according to the second embodiment.

As shown in FIG. 14C, the light-emitting element bonding step S406 bonds a light-emitting element 1 on the light-transmissive member 3 of each intermediate workpieces. In the light-emitting element bonding step S406, a bonding member 8 is formed on a bonding surface of the light-emitting element 1 and/or a bonding surface of the light-transmissive member 3 by an application method or the like, and those bonding surfaces are bonded to each other via the bonding member 8, thereby the light-emitting element 1 is bonded on the light-transmissive member 3.

Figure 14D:
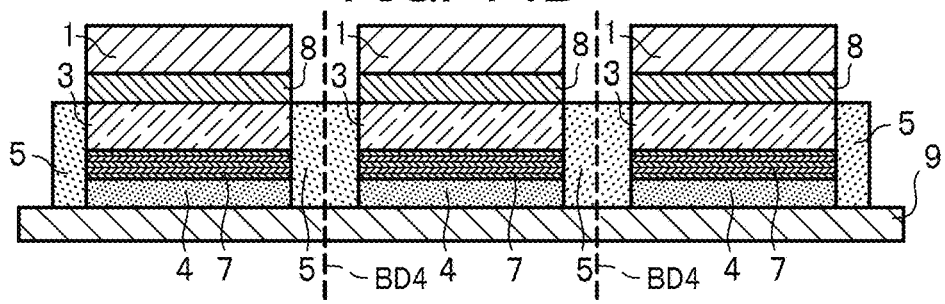
FIG. 14D is a cross-sectional view illustrating a cover layer dividing step of the method for manufacturing the light-emitting device according to the second embodiment.

As shown in FIG. 14D, the cover layer dividing step S407 divides the cover layer 5. The cover layer dividing step S407 produces third members 411 on the thermal release sheet 9 by dividing the cover layer 5 along division lines BD4 by, for example, blade dicing or laser dicing. Preferably, the division lines BD4 are each set at the center of an exposed surface of the corresponding exposed cover layer 5 in plan view.

Figure 14E:
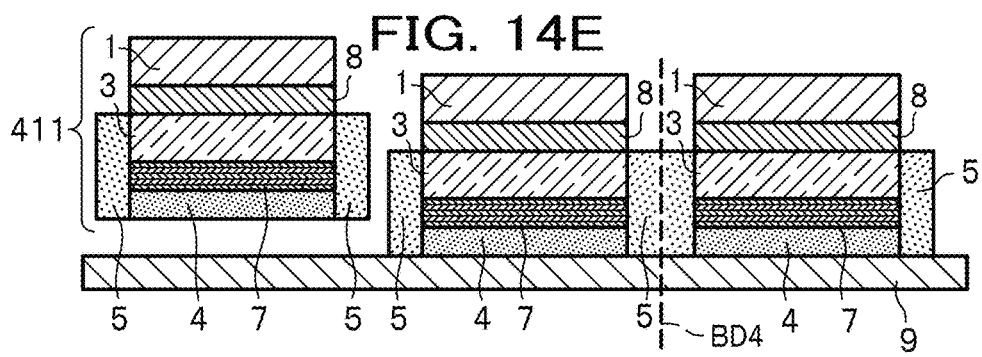
FIG. 14E is a cross-sectional view illustrating a third member separation step of the method for manufacturing the light-emitting device according to the second embodiment.

As shown in FIG. 14E, the third member separation step S408 separates the third members 411 from the thermal release sheet 9. In the third member separation step S408, the thermal release sheet 9 loses adhesiveness by being heated or irradiated with ultraviolet radiation to separate the third members 411. The foregoing steps complete the third member preparation step S41.

Figure 15A:
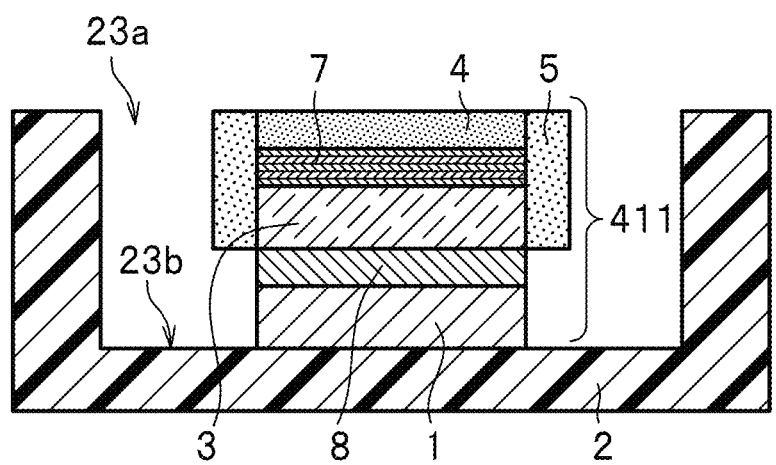
FIG. 15A is a cross-sectional view illustrating a light-emitting element mounting step of the method for manufacturing the light-emitting device according to the second embodiment.

As shown in FIG. 15A, the light-emitting element mounting step S42 mounts the light-emitting element 1 of each third member 411 on a base 2 having a recess 23a.

In the light-emitting element mounting step S42, the third member 411 is directly disposed on the base 2 having the recess 23a with the light-emitting element 1 located at the lowermost portion of the third member 411.

Figure 15B:
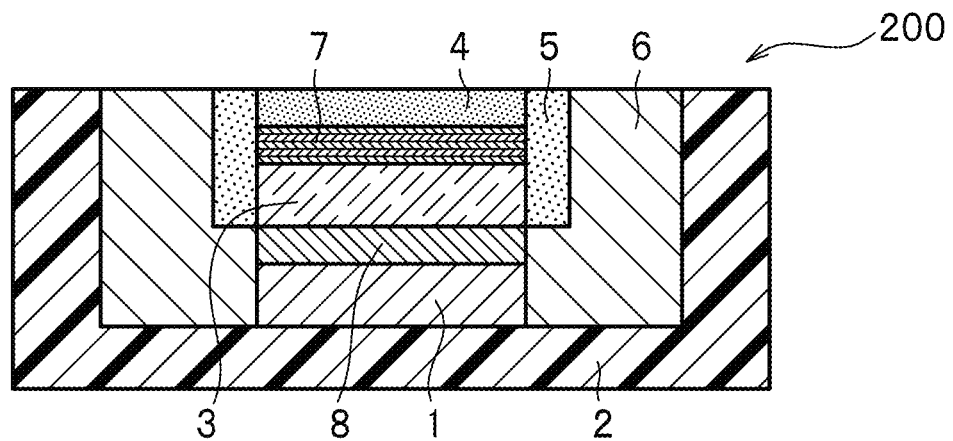
FIG. 15B is a cross-sectional view illustrating a light-reflective member disposing step of the method for manufacturing the light-emitting device according to the second embodiment.

As shown in FIG. 15B, the light-reflective member disposing step S43 provides a light-reflective member 6 in the recess 23a of each base 2 so as to cover at least a portion of side surfaces of the cover layer 5. In the light-reflective member disposing step S43 forms the light-reflective member 6 in the recess 23a of each base 2 by: filling the recess 23a with an uncured resin in which light-reflecting substance is dispersed, by, for example, potting using a dispenser; and then heating the resin at a predetermined temperature for a predetermined period of time by a heating device such as a heater or a reflow oven. The light-reflective member 6 is not formed over the phosphor layer 4 and the cover layer 5. Carrying out the above-described steps manufactures light-emitting devices 200.

EXAMPLES

We fabricated the light-emitting devices 100 in accordance with the method for manufacturing a light-emitting device according to the first embodiment. A fabricated light-emitting device 100 in which the cover layer 5 has been formed as a phosphor layer is referred to as Example 1. A fabricated light-emitting device 100 in which the cover layer 5 has been formed as a pigment layer is referred to as Example 2. Each of the constituent elements of the light-emitting devices 100 except the cover layer 5 (i.e., light-emitting element 1, base 2, light-transmissive member 3, phosphor layer 4, light-reflective member 6, dielectric multilayer film 7, and bonding member 8) was formed in the same manner between Examples 1 and 2.

Details of the constituent elements of Examples 1 and 2 are as follows:

Light-emitting element 1
Number of pieces: 1
Type: Blue LED having an emission peak wavelength at about 445 nm
External dimensions in plan view: 800 μm square
Height: 150 μm
Base 2
Material: Ceramics
Outer dimensions in plan view: 3.0 mm square
Inner dimensions in plan view: 2.3 mm square
Light-transmissive member 3
Material: Glass
External dimensions in plan view: 1.15 mm square
Shape: Flat plate
Thickness: 150 μm
Phosphor layer 4
Matrix material: Dimethyl silicone resin (manufactured by Shin-Etsu Chemical Co., Ltd; product name: KJR-9201; content: 35 mass %)
Phosphor: CASN (381-77; peak wavelength: 660 nm; particle diameter: intermediate; content: 65 mass %)
External dimensions in plan view: 1.15 mm square
Thickness: 68 μm
Cover layer 5

Example 1 (Phosphor Layer)

Matrix material: Silicone resin (manufactured by Shin-Etsu Chemical Co., Ltd; product name: SCR1011-H2; 100 phr)
Phosphor: CASN (Model number: 381-77; 100 phr)
Filler: Silica (Model number: 999-101; content: 0.5 mass %)
Outer dimensions in plan view: 1.35 mm square
Inner dimensions in plan view: 1.15 mm square
Thickness: 200 μm Example 2 (Pigment Layer)

Matrix material: Silicone resin (manufactured by Shin-Etsu Chemical Co., Ltd; product name: SCR1011-H2; 100 phr)
Pigment: "Titanium yellow TY-50" manufactured by Ishihara Sangyo Kaisya, LTD. (50 phr)
Filler: Silica (Model number: 999-101; content: 0.5 mass %)
Outer dimensions in plan view: 1.35 mm square
Inner dimensions in plan view: 1.15 mm square
Thickness: 200 μm
Light-reflective member 6
Matrix material: Silicone resin (content: 62.5 mass %)
Light-reflective substance: Titanium oxide (particle diameter: 0.5 μm; content: 37.5 mass %)
Heating temperature: Approx. 150° C.
Heating period: Approx. 4 hours
Dielectric multilayer film 7
Total thickness: 2 μm
1st layer: $SiO_2$; film thickness: 33.84 nm
2nd layer: $Nb_2O_5$; film thickness: 19.94 nm
3rd layer: $SiO_2$; film thickness: 85.01 nm
4th layer: $Nb_2O_5$; film thickness: 35.82 nm
5th layer: $SiO_2$; film thickness: 92.45 nm
6th layer: $Nb_2O_5$; film thickness: 39.31 nm
7th layer: $SiO_2$; film thickness: 73.92 nm
8th layer: $Nb_2O_5$; film thickness: 48.31 nm
9th layer: $SiO_2$; film thickness: 59.86 nm
10th layer: $Nb_2O_5$; film thickness: 32.65 nm
11th layer: $SiO_2$; film thickness: 51.14 nm
12th layer: $Nb_2O_5$; film thickness: 38.08 nm
13th layer: $SiO_2$; film thickness: 65.57 nm
14th layer: $Nb_2O_5$; film thickness: 47.57 nm
15th layer: $SiO_2$; film thickness: 79.54 nm
16th layer: $Nb_2O_5$; film thickness: 47.89 nm
17th layer: $SiO_2$; film thickness: 79.57 nm
18th layer: $Nb_2O_5$; film thickness: 49.51 nm
19th layer: $SiO_2$; film thickness: 78.69 nm
20th layer: $Nb_2O_5$; film thickness: 50.64 nm 21th layer: SiO$_2$; film thickness: 78.58 nm
22nd layer: Nb$_2$O$_5$; film thickness: 51.55 nm
23rd layer: SiO$_2$; film thickness: 69.52 nm
24th layer: Nb$_2$O$_5$; film thickness: 55.33 nm
25th layer: SiO$_2$; film thickness: 76.94 nm
26th layer: Nb$_2$O$_5$; film thickness: 45.91 nm
27th layer: SiO$_2$; film thickness: 73.83 nm
28th layer: Nb$_2$O$_5$; film thickness: 47.58 nm
29th layer: SiO$_2$; film thickness: 77.97 nm
30th layer: Nb$_2$O$_5$; film thickness: 21.51 nm
31st layer: SiO$_2$; film thickness: 187.16 nm
Bonding member 8
Material: Silicone resin
External dimensions in plan view: 1.15 mm square
Thickness: 10 μm Comparative Example We fabricated a light-emitting device of Comparative Example for comparison with the light-emitting devices of Examples. Comparative Example 1 was a light-emitting device in which the constituent elements of the light-emitting devices of Examples 1 and 2 except the cover layer 5 (i.e., light-emitting element 1, base 2, light-transmissive member 3, phosphor layer 4, light-reflective member 6, dielectric multilayer film 7, and bonding member 8) were formed in the same manner as in the Examples 1 and 2. Details of those constituent elements of the Comparative Example 1 are the same as those described above.

Evaluation

The light-emitting devices of Examples 1 and 2 and Comparative Example 1 were evaluated. The results of the evaluation are indicated in Table 1 below.

TABLE 1

| | x | y | φv [lm] | λ$_d$ [nm] | λ$_p$ [nm] |
|---|---|---|---|---|---|
| Example 1 (red phosphor) | 0.6935 | 0.3050 | 11.7 | 621.8 | 657.2 |
| Example 2 (pigment) | 0.6920 | 0.3063 | 10.7 | 621.1 | 654.2 |
| Comparative Example 1 | 0.6923 | 0.3052 | 12.1 | 621.7 | 655.2 |

Table 1 indicates the results of measurement of chromaticity coordinates, total light flux, dominant wavelength, and peak wavelength for each of Examples 1 and 2 and Comparative Example 1, where "x" indicates an x coordinate in the chromaticity coordinate system; "y" indicates a y coordinate in the chromaticity coordinate system; "φv[lm]" indicates the luminance of the light emitted by the light-emitting device of each of Examples 1 and 2 and Comparative Example 1; "λ$_d$[nm]" indicates a wavelength that corresponds to a color perceived by human eyes for the light emitted by the light-emitting device of each of Examples 1 and 2 and Comparative Example 1; "λ$_p$[nm]" indicates a wavelength that corresponds to the strongest peak in the spectrum of the light emitted by the light-emitting device of each of Examples 1 and 2 and Comparative Example 1.

As to values of φv, Comparative Example 1 exhibited the greatest value. As to values of λ$_d$ and λ$_p$, Example 1 exhibited the greatest value, and Example 2 exhibited the smallest value. It thus found that the cover layer 5 disposed on lateral surfaces of the phosphor layer 4 and the third surfaces of the light-transmissive member 3 caused a slight decrease in the luminance of light emitted by the light-emitting devices. In addition, it was found that the light-emitting device of Example 2 emitted light close to yellow, and the light-emitting device of Example 1 emitted light close to deep red.

Figure 16:
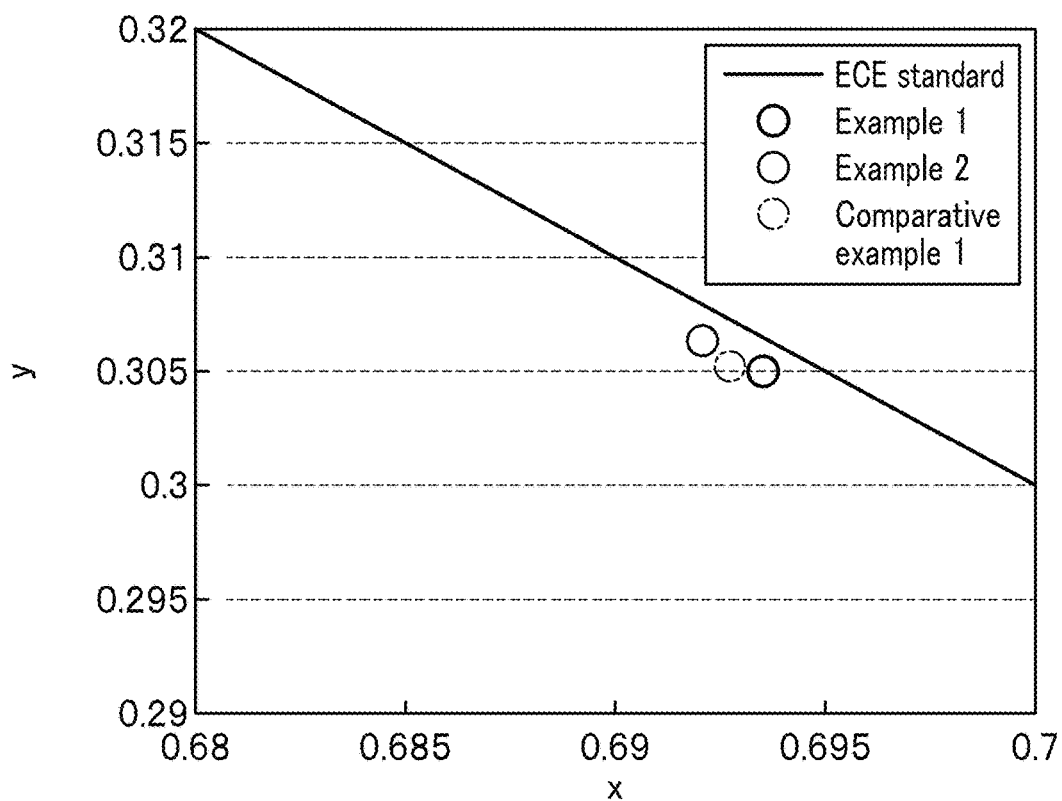
FIG. 16 is a diagram illustrating the relationship between the ECE standard and the chromaticity coordinates.

FIG. 16 plots the xy chromaticity coordinates of Examples 1 and 2 and Comparative Example 1 indicated by Table 1. In FIG. 16, the solid line indicates the ECE standard, the thick circle indicates Example 1, the thin circle indicates Example 2, and the long- and double short-dashed circle indicates Comparative Example 1. Here, the ECE standard is a unified standard pertaining to light distribution, chromaticity and the like and adopted by major countries including Japan. The closer the xy chromaticity coordinates of a light-emitting device is plotted to the solid line (ECE standard), the higher color purity the red light of the light-emitting device has.

As shown in FIG. 16, the chromaticity coordinates of Example 1 was closest to the ECE standard, and the chromaticity coordinates of Comparative Example 1 was farthest from the ECE standard. It thus found that the cover layer 5 disposed on the lateral surfaces of the phosphor layer 4 and the third surfaces of the light-transmissive member 3 increased the color purity of the red light of the light-emitting devices.

Figure 17:
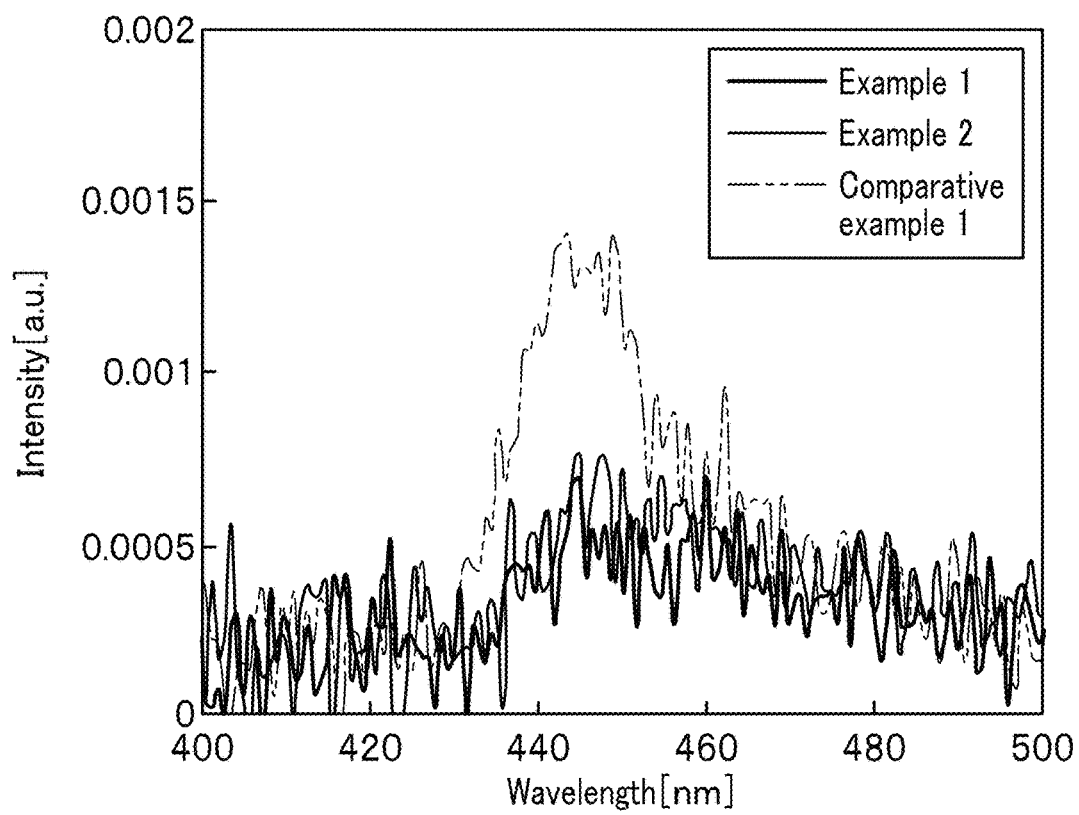
FIG. 17 shows a graph representing relationship between wavelength and light intensity.

FIG. 17 shows a graph representing the relationship between the wavelength and the light intensity in each of Examples 1 and 2 and Comparative Example 1. The vertical axis represents light intensity [a.u. (arbitrary unit)], and the horizontal axis represents wavelength [nm]. In FIG. 17, the thick line indicates Example 1, the thin line indicates Example 2, and the long- and double short-dashed line indicates Comparative Example 1.

As understood from FIG. 17, the light of Comparative Example 1 has the greatest intensity of blue light. It thus found that the cover layer 5 disposed on the lateral surfaces of the phosphor layer 4 and the third surfaces of the light-transmissive member 3 decreased leakage of blue light from the light-emitting device.

Figure 18:
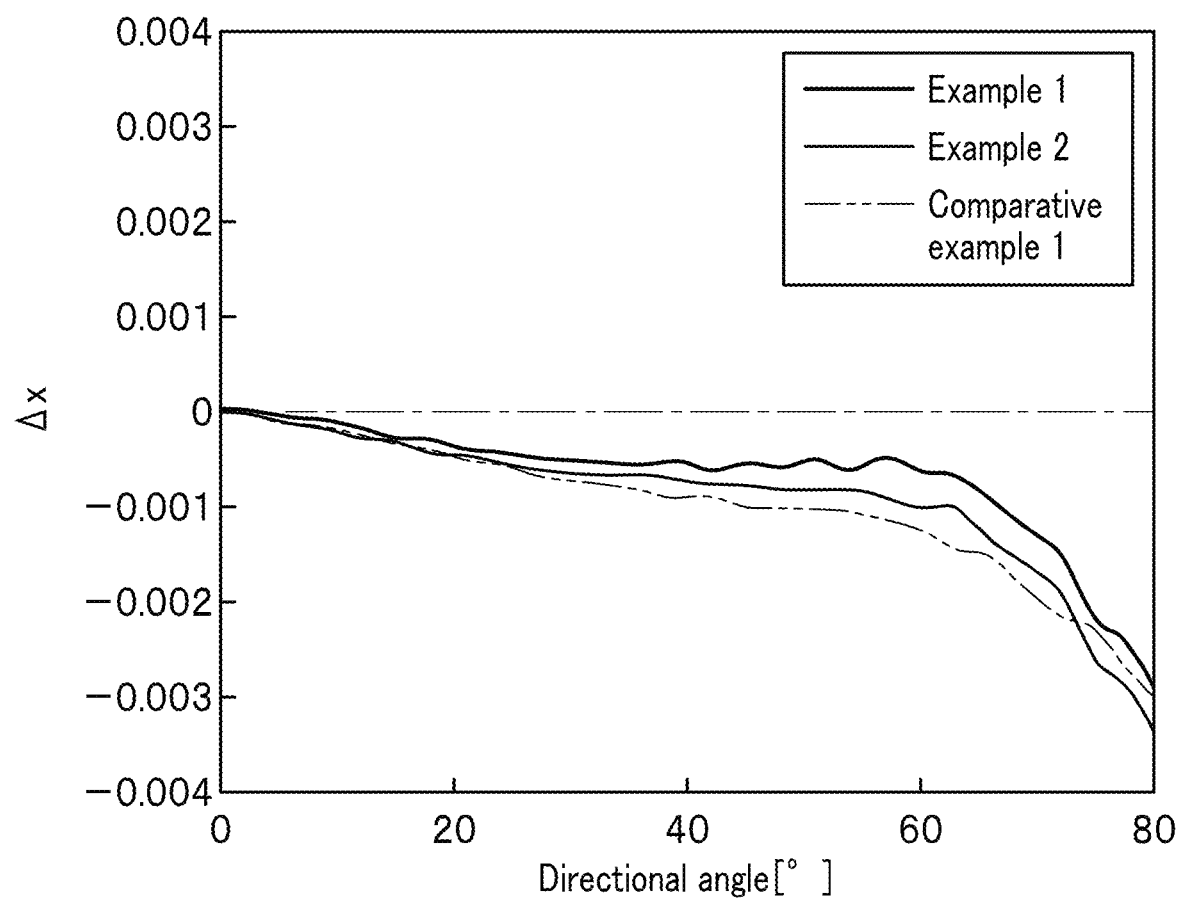
FIG. 18 shows a graph representing relationship between directional angles and chromaticity distribution.

FIG. 18 shows a graph representing the relationship between the directional angle and the chromaticity distribution in Examples 1 and 2 and Comparative Example 1. The vertical axis represents chromaticity distribution Δx (variation in the xy chromaticity diagram), and the horizontal axis represents the directional angle [°]. In FIG. 18, the thick line indicates Example 1, the thin line indicates Example 2, and the long- and double short-dashed line indicates Comparative Example 1.

As shown in FIG. 18, in each of Examples 1 and 2 and Comparative Example 1, the greater the directional angle, the greater the absolute value of the chromaticity distribution Δx. In particular, the absolute value of the chromaticity distribution Δx rapidly increases with directional angle in the range of 60° or more. With directional angles in the range of 0° to about 30°, there is no significant difference in the chromaticity distribution Δx between Examples 1 and 2 and Comparative Example 1. However, with the directional angles in the range of about 30° to about 75°, the absolute value of the chromaticity distribution Δx of Comparative Example 1 is the greatest.

It thus found that the cover layer 5 disposed on the lateral surfaces of the phosphor layer 4 and the third surfaces of the light-transmissive member 3 reduced the chromaticity shift occurring in the light-emitting devices. In addition, it found that, with directional angles in the range of 75° or more, the chromaticity shift occurring in the light-emitting devices could not be reduced irrespective of the presence of the cover layer 5.

Figure 19A:
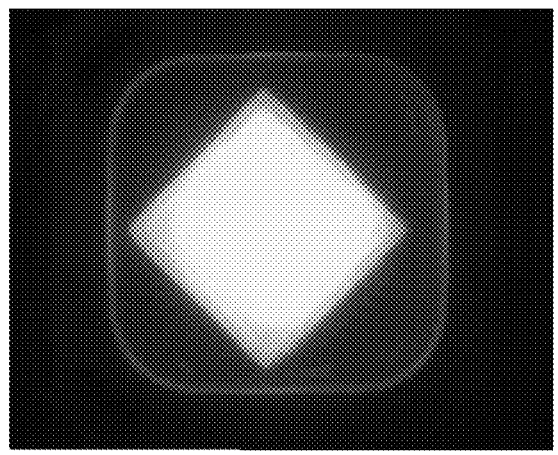
FIG. 19A shows appearance of a light-emitting device of Example 1 when the light-emitting device is made to emit light.
Figure 19B:
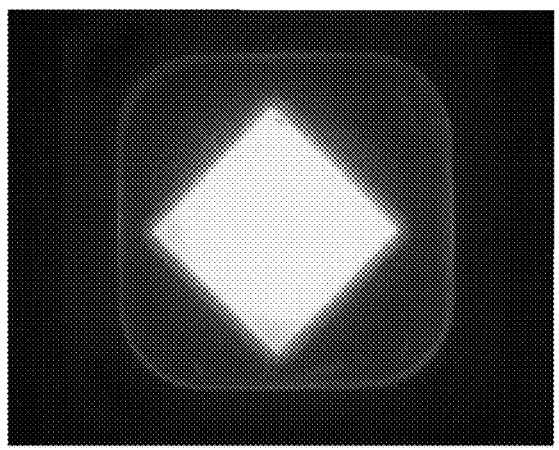
FIG. 19B shows appearance of a light-emitting device of Example 2 when the light-emitting device is made to emit light.
Figure 19C:
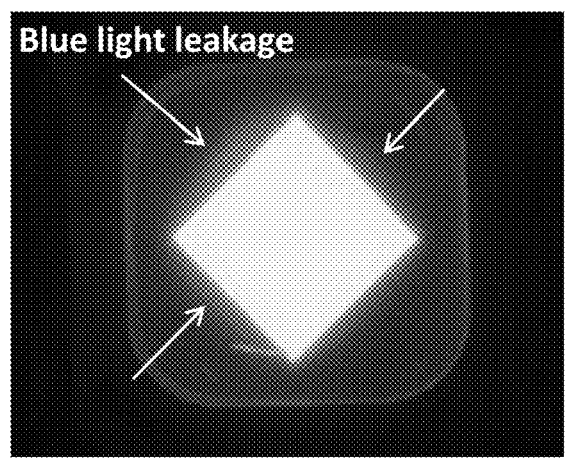
FIG. 19C shows appearance of a light-emitting device of Comparative Example 1 when the light-emitting device is made to emit light.

FIGS. 19A to 19C respectively show the external appearance of the light-emitting devices of Examples 1 and 2 and Comparative Example 1 when the light-emitting devices are made to emit light with a drive current of 10 mA.

FIG. 19A shows that the light-emitting device of Example 1 exhibits a small amount of leakage of blue light from lateral surfaces of the glass (light-transmissive member 3), and that, although the apparent color shift of the light-emitting device of Example 1 is small, the light-emitting device of Example 1 exhibits slight luminance unevenness between the center of the glass and the side surfaces of the glass.

FIG. 19B shows that the light-emitting device of Example 2 has slight leakage of blue light from the lateral surfaces of the glass, and that the light-emitting device of Example 2 has slight luminance unevenness between the center of the glass and the side surfaces of the glass.

FIG. 19C shows that the light-emitting device of Comparative Example 1 has significantly large leakage of blue light from the lateral surfaces of the glass. In addition, it found that from a color image, in the light-emitting device of Comparative Example 1, the leaked blue light reflected by the light-reflective member was observed as violet light around the light-emitting element.

In view of the foregoing, it is found that disposing the cover layer 5 on the lateral surfaces of the phosphor layer 4 and the third surfaces of the light-transmissive member 3 allows reduction of the leakage of blue light in the light-emitting device. In addition, it is found that the light-emitting device whose cover layer 5 is formed with a phosphor layer can inhibit the color shift most.

On the basis of the evaluation described above, it is found that disposing the cover layer 5 on the lateral surfaces of the phosphor layer 4 and the third surfaces of the light-transmissive member 3 allows reduction of the leakage of blue light from the light-emitting device and allows obtaining high color purity of red light of the light-emitting device. Moreover, it is found that disposing the cover layer 5 on the lateral surfaces of the phosphor layer 4 and the third surfaces of the light-transmissive member 3 allows reduction of the leakage of blue light from the light-emitting element even when the blue light enters the dielectric multilayer film at a large angle of incidence.

The embodiments for carrying out the invention have been specifically described. It should be noted, however, that the spirit of the present invention is not limited thereto and should be construed broadly based on the scope of claims. It goes without saying that the spirit of the present invention includes also variations and modifications based on the foregoing descriptions.

The light-emitting devices of the embodiments according to the present disclosure are applicable to automotive light-emitting devices and the like.

What is claimed is:

1. A method of manufacturing a light-emitting device, the method comprising steps of:
   preparing at least one first member each comprising (i) a light-transmissive member having a top surface, a bottom surface opposite the top surface, and a lateral surface contiguous with the top surface and the bottom surface, (ii) a phosphor layer disposed below the bottom surface of the light-transmissive member, and (iii) a cover layer disposed on and in direct contact with a lateral surface of the phosphor layer and the lateral surface of the light-transmissive member; and,
   for each of the at least one first member,
   providing a base having a flat plate shape,
   mounting a light-emitting element on the base,
   bonding the light-emitting element and the phosphor layer of the first member together,
   placing a frame body on the base so as to surround the light-emitting element, and
   filling a light-reflective member in the frame body so that the light-reflective member covers at least a portion of the cover layer of the first member.

2. The method of claim 1,
   wherein in the bonding step, the light-emitting element and the phosphor layer of each of the at least one first member are bonded via a bonding member made of a material that is same as a matrix material of the phosphor layer.

3. The method of claim 1,
   wherein in the step of filling the light-reflective member in the frame body, the light-reflective member is filled so that the light-reflective member further covers at least a portion of a lateral surface of the light emitting element.

4. The method of claim 1,
   wherein the step of preparing the at least one first member comprises steps of:
   forming a dielectric multilayer film on an initial light-transmissive layer;
   forming an initial phosphor layer on the dielectric multilayer film;
   dividing the initial light-transmissive layer, the dielectric multilayer film, the initial phosphor layer together into first intermediate workpieces;
   placing the first intermediate workpieces on a thermal release sheet at predetermined intervals with the initial phosphor layer located at the lowermost portion of the first intermediate workpieces;
   filling an initial cover layer between the first intermediate workpieces on the thermal release sheet;
   dividing the initial cover layer so as to produce second intermediate workpieces each including one of the first intermediate workpieces and at least a portion of the initial cover layer and serving as one of the at least one first member, wherein the initial light-transmissive layer in the one of the first intermediate workpieces serves as the light-transmissive member of the one of the at least one first member, the initial phosphor layer in the one of the first intermediate workpieces serves as the phosphor layer of the one of the at least one first member, and the at least a portion of the initial cover layer serves as the cover layer of the one of the at least one first member; and
   separating the second intermediate workpieces from the thermal release sheet as the at least one first member.

5. The method of claim 4, wherein the step of forming the initial phosphor layer is performed by screen printing.

6. The method of claim 1, wherein the at least one first member each have a flat plate shape as a whole.

7. A method of manufacturing a light-emitting device, the method comprising steps of:
   preparing at least one second member each comprising (i) a light-transmissive member having a top surface, a bottom surface opposite the top surface, and a lateral surface contiguous with the top surface and the bottom surface, (ii) a phosphor layer disposed below the bottom surface of the light-transmissive member, (iii) a cover layer disposed on and in direct contact with a lateral surface of the phosphor layer and the lateral surface of the light-transmissive member, and (iv) a light-emitting element disposed below the phosphor layer; and, for each of the at least one second member,
providing a base having a flat plate shape,
mounting the light-emitting element of the second member on the base,
placing a frame body on the base so as to surround the light-emitting element, and
filling a light-reflective member in the frame body so that the light-reflective member covers at least a portion of the cover layer of the second member.

8. The method of claim 7,
wherein in the step of filling the light-reflective member in the frame body, the light-reflective member is filled so that the light-reflective member further covers at least a portion of a lateral surface of the light emitting element.

9. The method of claim 7,
wherein the step of preparing the at least one second member comprises steps of:
forming a dielectric multilayer film on an initial light-transmissive layer;
forming an initial phosphor layer on the dielectric multilayer film;
dividing the initial light-transmissive layer, the dielectric multilayer film, the initial phosphor layer together into first intermediate workpieces;
placing the first intermediate workpieces on a thermal release sheet at predetermined intervals with the initial light-transmissive layer located at the lowermost portion of the first intermediate workpieces;
filling an initial cover layer between the first intermediate workpieces on the thermal release sheet;
mounting a light-emitting element on the initial phosphor layer of each of the first intermediate workpieces;
dividing the initial cover layer so as to produce second intermediate workpieces each including one of the first intermediate workpieces, the light-emitting element mounted on the one of the first intermediate workpieces, and at least a portion of the initial cover layer and serving as one of the at least one second member, wherein the initial light-transmissive layer in the one of the first intermediate workpieces serves as the light-transmissive member of the one of the at least one second member, the initial phosphor layer in the one of the first intermediate workpieces serves as the phosphor layer of the one of the at least one second member, the light-emitting element mounted on the one of the first intermediate workpieces serves as the light-emitting element of the one of the at least one second member, and the at least a portion of the initial cover layer serves as the cover layer of the one of the at least one second member; and
separating the second intermediate workpieces from the thermal release sheet as the at least one second member.

10. The method of claim 9, wherein the step of forming the initial phosphor layer is performed by screen printing.

11. The method of claim 9,
wherein in the step of mounting the light-emitting element on the initial phosphor layer of each of the first intermediate workpieces, the light-emitting element and the initial phosphor layer of each of the first intermediate workpieces are bonded via a bonding member made of a material that is same as a matrix material of the initial phosphor layer.

12. The method of claim 7, wherein the at least one second member each have a flat plate shape as a whole.

13. A method of manufacturing a light-emitting device, the method comprising steps of:
preparing at least one third member each comprising (i) a light-transmissive member having a top surface, a bottom surface opposite the top surface, and a lateral surface contiguous with the top surface and the bottom surface, (ii) a phosphor layer disposed above the top surface of the light-transmissive member, (iii) a cover layer disposed on and in direct contact with a lateral surface of the phosphor layer and the lateral surface of the light-transmissive member, and (iv) a light-emitting element disposed below the light-transmissive member; and, for each of the at least one third member,
providing a base having a flat plate shape,
mounting the light-emitting element of the third member on the base,
placing a frame body on the base so as to surround the light-emitting element, and
filling a light-reflective member in the frame body so that the light-reflective member covers at least a portion of the cover layer of the third member.

14. The method of claim 13,
wherein in the step of filling the light-reflective member in the frame body, the light-reflective member is filled so that the light-reflective member further covers at least a portion of a lateral surface of the light emitting element.

15. The method of claim 13,
wherein the step of preparing the at least one third member comprises steps of:
forming a dielectric multilayer film on an initial light-transmissive member;
forming an initial phosphor layer on the dielectric multilayer film;
dividing the initial light-transmissive member, the dielectric multilayer film, and the initial phosphor layer together into first intermediate workpieces;
placing the first intermediate workpieces on a thermal release sheet at predetermined intervals with the initial phosphor layer located at the lowermost portion of the first intermediate workpieces;
filling an initial cover layer between the first intermediate workpieces on the thermal release sheet;
mounting a light-emitting element on the initial light-transmissive member of each of the first intermediate workpieces;
dividing the initial cover layer to produce second intermediate workpieces each including one of the first intermediate workpieces, the light-emitting element mounted on the one of the first intermediate workpieces, and at least a portion of the initial cover layer and serving as one of the at least one third member, wherein the initial light-transmissive layer in the one of the first intermediate workpieces serves as the light-transmissive member of the one of the at least one third member, the initial phosphor layer in the one of the first intermediate workpieces serves as the phosphor layer of the one of the at least one third member, and the light-emitting element mounted on the one of the first intermediate workpieces serves as the light-emitting element of the one of the at least one third member; and separating the second intermediate workpieces from the thermal release sheet as the at least one third member.

16. The method of claim 15, wherein the step of forming the initial phosphor layer is performed by screen printing.

17. The method of claim 15, wherein in the step of mounting the light-emitting element on the initial light-transmissive member of each of the first intermediate workpieces, the light-emitting element and the initial light-transmissive member of each of the first intermediate workpieces are bonded via a bonding member made of a material that is same as a matrix material of the initial light-transmissive member.

18. The method of claim 13, wherein the at least one third member each have a flat plate shape as a whole.

* * * * *